US010265785B2

United States Patent
Tatsuoka et al.

(10) Patent No.: US 10,265,785 B2
(45) Date of Patent: Apr. 23, 2019

(54) SURFACE-COATED CUTTING TOOL AND METHOD FOR PRODUCING THE SAME

(71) Applicant: MITSUBISHI MATERIALS CORPORATION, Tokyo (JP)

(72) Inventors: Sho Tatsuoka, Naka (JP); Kenichi Sato, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 177 days.

(21) Appl. No.: 15/128,365

(22) PCT Filed: Mar. 26, 2015

(86) PCT No.: PCT/JP2015/059362
§ 371 (c)(1),
(2) Date: Sep. 22, 2016

(87) PCT Pub. No.: WO2015/147160
PCT Pub. Date: Oct. 1, 2015

(65) Prior Publication Data
US 2017/0113285 A1    Apr. 27, 2017

(30) Foreign Application Priority Data

Mar. 26, 2014 (JP) .................................. 2014-063114
Mar. 20, 2015 (JP) .................................. 2015-057996

(51) Int. Cl.
*C23C 16/34* (2006.01)
*B23C 5/16* (2006.01)
(Continued)

(52) U.S. Cl.
CPC ................ *B23C 5/16* (2013.01); *C23C 16/34* (2013.01); *C23C 16/36* (2013.01);
(Continued)

(58) Field of Classification Search
USPC .......... 51/307, 309; 428/336, 697, 698, 699, 428/701, 702, 704; 427/255, 255.23,
(Continued)

(56) References Cited

U.S. PATENT DOCUMENTS

2010/0323176 A1    12/2010    Van Den Berg et al.
2011/0003126 A1    1/2011    Van Den Berg et al.
(Continued)

FOREIGN PATENT DOCUMENTS

| CN | 101952480 A | 1/2011 |
| CN | 101970716 A | 2/2011 |

(Continued)

OTHER PUBLICATIONS

Office Action dated May 2, 2017 for the corresponding Chinese Patent Application No. 201580015577.2.
(Continued)

*Primary Examiner* — Archene A Turner
(74) *Attorney, Agent, or Firm* — Leason Ellis LLP

(57) ABSTRACT

A surface-coated cutting tool of the present invention includes: a cutting tool body; and a hard coating layer provided on a surface of the cutting tool body, in which the hard coating layer includes a complex nitride or carbonitride layer, which is expressed by a composition formula: $(Ti_{1-x}Al_x)(C_yN_{1-y})$, the average content ratio $X_{avg}$ of Al and the average content ratio $Y_{avg}$ of C in the complex nitride or carbonitride layer satisfy $0.60 \leq X_{avg} \leq 0.95$ and $0 \leq Y_{avg} \leq 0.005$, provided that each of $X_{avg}$ and $Y_{avg}$ is in atomic ratio, the complex nitride or carbonitride layer includes crystal grains with a cubic structure, and in the crystal grains with the cubic structure, a composition of Ti and Al is periodically changed in a direction of the normal line to the surface of the cutting tool body.

9 Claims, 5 Drawing Sheets

(51) Int. Cl.
*C23C 28/04* (2006.01)
*C23C 28/00* (2006.01)
*C23C 16/36* (2006.01)
*C23C 16/455* (2006.01)
*C23C 16/458* (2006.01)

(52) U.S. Cl.
CPC .... *C23C 16/4581* (2013.01); *C23C 16/45523* (2013.01); *C23C 28/042* (2013.01); *C23C 28/044* (2013.01); *C23C 28/42* (2013.01); *C23C 28/44* (2013.01); *B23B 2228/10* (2013.01); *B23C 2228/10* (2013.01)

(58) Field of Classification Search
USPC .................. 427/255.28, 255.39, 255.391
See application file for complete search history.

(56) References Cited

U.S. PATENT DOCUMENTS

| | | | | |
|---|---|---|---|---|
| 2015/0158094 A1* | 6/2015 | Igarashi | ............... | C23C 16/36 428/336 |
| 2015/0217378 A1* | 8/2015 | Tatsuoka | ............... | C23C 16/36 428/697 |

FOREIGN PATENT DOCUMENTS

| | | | |
|---|---|---|---|
| CN | 101970717 | A | 2/2011 |
| CN | 102686772 | A | 9/2012 |
| EP | 0560287 | A | 9/1993 |
| EP | 2823923 | A | 1/2015 |
| EP | 2891536 | A | 7/2015 |
| JP | 08-151297 | A | 6/1996 |
| JP | 2004-225065 | A | 8/2004 |
| JP | 2008-100320 | A | 5/2008 |
| JP | 2008-188734 | A | 8/2008 |
| JP | 2009-056540 | A | 3/2009 |
| JP | 2011-513594 | A | 4/2011 |
| JP | 2011-516722 | A | 5/2011 |
| JP | 2014-024131 | * | 2/2014 |
| JP | 2014-024131 | A | 2/2014 |
| WO | WO-2013/133441 | A | 9/2013 |
| WO | WO-2014/034730 | A | 3/2014 |

OTHER PUBLICATIONS

International Search Report dated Jun. 23, 2015 for the corresponding PCT Application No. PCT/JP2015/059362.
Extended European Search Report dated Sep. 19, 2017 for the corresponding European Patent Application No. 15768503.3.

* cited by examiner

SURFACE-COATED CUTTING TOOL AND METHOD FOR PRODUCING THE SAME

CROSS-REFERENCE TO RELATED PATENT APPLICATIONS

This application is a U.S. National Phase Application under 35 U.S.C. § 371 of International Patent Application No. PCT/JP2015/059362, filed Mar. 26, 2015, and claims the benefit of Japanese Patent Applications No. 2014-063114, filed Mar. 26, 2014 and No. 2015-057996, filed Mar. 20, 2015, all of which are incorporated by reference herein in their entireties. The International Application was published in Japanese on Oct. 1, 2015 as International Publication No. WO/2015/147160 under PCT Article 21(2).

FIELD OF THE INVENTION

The present invention relates to a surface-coated cutting tool having a hard coating layer which exhibits excellent chipping resistance. Specifically, the present invention relates to a surface-coated cutting tool (hereinafter, referred to as coated tool), in which a hard coating layer exhibits excellent chipping resistance and excellent cutting performance is exhibited for long-term usage during high-speed intermittent cutting work of alloy steel or the like during which high-temperature heat is generated and an impact load is exerted on a cutting edge.

BACKGROUND OF THE INVENTION

Hitherto, in general, a coated tool in which the surface of a cutting tool body made of tungsten carbide (hereinafter, referred to as WC)-based cemented carbide, titanium carbonitride (hereinafter, referred to as TiCN)-based cermet, or cubic boron nitride (hereinafter, referred to as cBN)-based ultra-high pressure sintered material (hereinafter, collectively referred to as a cutting tool body) is coated with a Ti—Al-based complex nitride layer as a hard coating layer through a physical vapor deposition method, is known. It is known that such a coated tool exhibits excellent wear resistance.

Although the conventional coated tool coated with the Ti—Al-based complex nitride layer has relatively excellent wear resistance, in a case of using the coated tool under high-speed intermittent cutting conditions, abnormal wear such as chipping easily occurs. Therefore, various suggestions for an improvement in the hard coating layer have been made.

For example, PTL 1 discloses that a hard coating layer is formed on the surface of a cutting tool body. The hard coating layer is made of an Al and Ti complex nitride layer which satisfies a composition formula $(Al_xTi_{1-x})N$, provided that x is 0.40 to 0.65 in terms of atomic ratio. In a case where crystal orientation analysis is performed on the complex nitride layer through electron backscatter diffraction (EBSD), the area ratio of crystal grains with a crystal orientation <100> in a range of 0° to 15° from a direction of the normal line to a polished surface is 50% or more, and in a case where angles between the crystal grains adjacent to each other are measured, a crystal arrangement in which the proportion of low-angle grain boundaries (0°<θ≤15°) is 50% or more is exhibited. PTL 1 discloses that by depositing the hard coating layer made of the Al and Ti complex nitride layer on the surface of the cutting tool body, the hard coating layer exhibits excellent defect resistance even under high-speed intermittent cutting conditions.

In the coated tool of PTL 1, since the hard coating layer is deposited by a physical vapor deposition method, it is difficult to cause the content ratio x of Al to be 0.65 or more, and a further improvement in cutting performance is desired.

From this viewpoint, a technique for increasing the content ratio x of Al to about 0.9 by forming a hard coating layer through a chemical vapor deposition method is suggested.

For example, PTL 2 describes that by performing chemical vapor deposition in a mixed reaction gas of $TiCl_4$, $AlCl_3$, and $NH_3$ in a temperature range of 650° C. to 900° C., a $(Ti_{1-x}Al_x)N$ layer in which the content ratio x of Al is 0.65 to 0.95 can be deposited. However, PTL 2 is aimed at further coating the $(Ti_{1-x}Al_x)N$ layer with an $Al_2O_3$ layer and thus improving the heat insulation effect. Therefore, the effect of the formation of the $(Ti_{1-x}Al_x)N$ layer in which the content ratio x of Al is increased to 0.65 to 0.95 on cutting performance is not clear.

In addition, for example, PTL 3 suggests that the heat resistance and fatigue strength of a coated tool are improved by coating the outside of a TiCN layer and an $Al_2O_3$ layer as inner layers with a $(Ti_{1-x}Al_x)N$ layer with a cubic structure or a cubic structure including a hexagonal structure as an outer layer using a chemical vapor deposition method, provided that x is 0.65 to 0.90 in terms of atomic ratio, and applying a compressive stress of 100 to 1100 MPa to the outer layer.

CITATION LIST

Patent Literature

[PTL 1] Japanese Unexamined Patent Application, First Publication No. 2009-56540

[PTL 2] Published Japanese Translation No. 2011-516722 of the PCT International Publication

[PTL 3] Published Japanese Translation No. 2011-513594 of the PCT International Publication

Technical Problem

There has been a strong demand for power saving and energy saving during cutting work in recent years. In accordance with this, there is a trend toward a further increase in speed and efficiency during cutting work. Therefore, an improvement in abnormal damage resistance such as chipping resistance, defect resistance, and peeling resistance is further required for a coated tool, and excellent wear resistance is required for long-term usage.

However, in the coated tool described in PTL 1, since the hard coating layer made of the $(Ti_{1-x}Al_x)N$ layer is deposited through the physical vapor deposition method, for example, it is difficult to increase the content ratio x of Al in the hard coating layer. Therefore, for example, in a case where the coated tool is provided for high-speed intermittent cutting of alloy steel or the like, there is a problem in that it cannot be said that the wear resistance and chipping resistance are sufficient.

In the $(Ti_{1-x}Al_x)N$ layer deposited through the chemical vapor deposition method described in PTL 2, since the content ratio x of Al can be increased and the cubic structure can be formed, a hard coating layer having a predetermined hardness and excellent wear resistance can be obtained. On the other hand, there is a problem of a poorness in toughness.

Although the coated tool described in PTL 3 has a predetermined hardness and excellent wear resistance, the toughness thereof is poor. Therefore, in a case where the coated tool is provided for high-speed intermittent cutting work of alloy steel or the like, there are problems in that abnormal damage such as chipping, defect, and peeling easily occurs and it cannot be said that satisfactory cutting performance is exhibited.

A technical problem to be solved by the present invention, that is, an object of the present invention is to provide a coated tool which has excellent toughness and exhibits excellent chipping resistance and wear resistance for long-term usage even in a case of being provided for high-speed intermittent cutting work of alloy steel or the like.

SUMMARY OF THE INVENTION

Solution to Problem

From the above-described viewpoints, the inventors intensively studied to improve the chipping resistance and wear resistance of a coated tool in which a hard coating layer including at least a Ti and Al complex nitride or complex carbonitride (hereinafter, sometimes referred to as "(Ti,Al) (C,N)" or "$(Ti_{1-x}Al_x)(C_yN_{1-y})$") is deposited through chemical vapor deposition. As a result, the following knowledge was obtained.

That is, in a conventional hard coating layer which includes at least one $(Ti_{1-x}Al_x)(C_yN_{1-y})$ layer and has a predetermined average layer thickness, in a case where the $(Ti_{1-x}Al_x)(C_yN_{1-y})$ layer is formed of columnar crystal grains extending in a direction perpendicular to the surface of a cutting tool body, the hard coating layer has high wear resistance. On the other hand, as the anisotropy of the $(Ti_{1-x}Al_x)(C_yN_{1-y})$ layer increases, the toughness of the $(Ti_{1-x}Al_x)(C_yN_{1-y})$ layer decreases. As a result, the chipping resistance and defect resistance thereof decrease, and wear resistance is insufficiently exhibited for long-term usage. In addition, it cannot be said that the tool life thereof is satisfactory.

The inventors intensively studied a $(Ti_{1-x}Al_x)(C_yN_{1-y})$ layer included in a hard coating layer, and on the basis of a completely novel idea that the composition of Ti and Al in crystal grains with a cubic crystal structure (cubic structure) in the $(Ti_{1-x}Al_x)(C_yN_{1-y})$ layer is periodically changed, succeeded in introducing strain into the crystal grains with the cubic crystal structure and increasing both hardness and toughness. As a result, novel knowledge that the chipping resistance and defect resistance of the hard coating layer can be improved was discovered.

Specifically, it was found that a hard coating layer comprises at least a Ti and Al complex nitride or carbonitride layer, which is formed by a chemical vapor deposition method; in a case where the composition of the layer is expressed by a composition formula: $(Ti_{1-x}Al_x)(C_yN_{1-y})$, the average content ratio $X_{avg}$, which is the ratio of Al to a total amount of Ti and Al: and the average content ratio $Y_{avg}$, which is the ratio of C to the total amount of C and N satisfy $0.60 \leq X_{avg} \leq 0.95$ and $0 \leq Y_{avg} \leq 0.005$, provided that each of $X_{avg}$ and $Y_{avg}$ is in atomic ratio; crystal grains with a cubic structure exist among crystal grains included in the complex nitride or carbonitride layer; in a case where crystal orientations of the crystal grains is analyzed from a vertical section direction using an electron backscatter diffraction apparatus: in an inclination angle frequency distribution, the highest peak exists in an inclination angle division in a range of 0° to 10° and the sum of frequencies in the range of 0° to 10° is 35% or more to the total frequencies in the inclination angle frequency distribution, the inclination angle frequency distribution being obtained by measuring inclination angles between a direction of the normal line to the surface of a cutting tool body and the normal lines to {100} planes as a crystal plane of the crystal grains, dividing inclination angles belonging to a range of 0° to 45° with respect to the direction of the normal line among the measured inclination angles every pitch of 0.25°, and counting the frequencies in each division; in the direction of the normal line to the surface of the cutting tool body: the composition of Ti and Al in the composition formula: $(Ti_{1-x}Al_x)(C_yN_{1-y})$ is periodically changed in the crystal grains with the cubic structure of the complex nitride or carbonitride layer; the interval of the period is 3 to 100 nm; and a difference obtained by subtracting the average of local minimum values from the average of local maximum values of x in the periodic composition change is 0.03 to 0.25, whereby strain is introduced into the crystal grains with the cubic structure, the hardness and toughness of the $(Ti_{1-x}Al_x)(C_yN_{1-y})$ layer are increased compared to a conventional hard coating layer, chipping resistance and defect resistance are correspondingly improved, and excellent wear resistance is exhibited for long-term usage.

In addition, the complex nitride or carbonitride layer ($(Ti_{1-x}Al_x)(C_yN_{1-y})$ layer) having the configuration described above can be formed by, for example, the following chemical vapor deposition method in which the composition of a reaction gas is periodically changed on the surface of the cutting tool body.

In a chemical vapor deposition reaction apparatus which is used, a gas group A of $NH_3$ and $H_2$ and a gas group B of $TiCl_4$, $Al(CH_3)_3$, $AlCl_3$, $NH_3$, $N_2$, and $H_2$ are supplied into the reaction apparatus from separate gas supply tubes. The gas group A and the gas group B are supplied into the reaction apparatus such that the gases are caused to flow at a predetermined period (at a predetermined time interval) only for a shorter time than the period. Specifically, the gas group A and the gas group B are supplied to cause a phase difference of a time shorter than the gas supply time to occur, such that the composition of the reaction gas in the vicinity of the surface of the cutting tool body can be changed over time between (A) the gas group A, (B) a mixed gas of the gas group A and the gas group B, and (C) the gas group B. Moreover, in the present invention, there is no need to introduce a long-term exhaust step intended for strict gas substitution. Therefore, as a gas supply method, for example, the composition of the reaction gas on the surface of the cutting tool body is changed over time (periodically) between (a) a mixed gas primarily containing the gas group A, (b) a mixed gas of the gas group A and the gas group B, and (c) a mixed gas primarily containing the gas group B, by rotating gas supply ports, rotating the cutting tool body, or reciprocating the cutting tool body. Accordingly, the complex nitride or carbonitride layer described above can be formed.

A $(Ti_{1-x}Al_x)(C_yN_{1-y})$ layer having a predetermined target layer thickness is formed on the surface of the cutting tool body by performing a thermal CVD method for a predetermined time, for example, using, as the composition of the reaction gas (% by volume with respect to the total amount of the gas group A and the gas group B), the gas group A of $NH_3$: 2.0% to 3.0% and $H_2$: 65% to 75% and the gas group B of $AlCl_3$: 0.6% to 0.9%, $TiCl_4$: 0.2% to 0.3%, $Al(CH_3)_3$: 0% to 0.5%, $N_2$: 0.0% to 12.0%, and $H_2$: the balance, under a reaction atmosphere pressure of 4.5 to 5.0 kPa, at a reaction atmosphere temperature of 700° C. to 900° C., with a supply period of 1 to 5 seconds, for a gas supply time of 0.15 to 0.25 seconds per one period, with a phase difference between gas supply A (the supply of the gas group A) and gas supply B (the supply of the gas group B) of 0.10 to 0.20 seconds.

As described above, the gas group A and the gas group B are supplied so that the times at which the gas group A and the gas group B arrive at the surface of the cutting tool body are different from each other. Accordingly, a local composition change of Ti and Al in the crystal grains is formed, rearrangement of atoms occurs to stabilize the composition change, and thus a periodic composition change occurs. As a result, it was found that toughness is dramatically improved while excellent wear resistance is provided. The number of the periodic composition change is not necessarily coincident with a value obtained by dividing the film thickness by the number of times of gas supply (the number of times of the supply of the gas group A or the gas group B) for the total film formation time. This fact indicates that crystal grains with a periodic composition change therein are formed by self-organization due to the rearrangement of atoms. As a result of the formation of the complex nitride or carbonitride layer in this step, particularly, the defect resistance and chipping resistance of the hard coating layer are improved. Therefore, it was found that even in a case where a tool having the hard coating layer is used for high-speed intermittent cutting work of alloy steel or the like during which intermittent and impact loads are exerted on a cutting edge, the hard coating layer can exhibit excellent cutting performance for long-term usage.

The present invention is made based on the above-described knowledge and has the following features.

(1) A surface-coated cutting tool comprising: a cutting tool body made of any one of tungsten carbide-based cemented carbide, titanium carbonitride-based cermet, and cubic boron nitride-based ultra-high pressure sintered material; and a hard coating layer provided on a surface of the cutting tool body, in which (a) the hard coating layer includes at least a Ti and Al complex nitride or carbonitride layer, which is formed by a chemical vapor deposition method and has an average layer thickness of 1 to 20 µm, in a case where a composition of the complex nitride or carbonitride layer is expressed by a composition formula: $(Ti_{1-x}Al_x)(C_yN_{1-y})$, the average content ratio $X_{avg}$, which is a ratio of Al to the total amount of Ti and Al in the complex nitride or carbonitride layer; and the average content ratio $Y_{avg}$, which is a ratio of C to a total amount of C and N in the complex nitride or carbonitride layer, satisfy $0.60 \leq X_{avg} \leq 0.95$ and $0 \leq Y_{avg} \leq 0.005$, provided that each of $X_{avg}$ and $Y_{avg}$ is in atomic ratio, (b) the complex nitride or carbonitride layer includes at least a phase constituted by complex nitride or complex carbonitride with a NaCl type face-centered cubic structure, (c) regarding the complex nitride or carbonitride layer, in a case where a crystal orientation of each of crystal grains with the NaCl type face-centered cubic structure in the complex nitride or carbonitride layer is analyzed from a vertical section direction of the complex nitride or carbonitride layer using an electron backscatter diffraction apparatus: in an inclination angle frequency distribution, the highest peak exists in an inclination angle division in a range of 0° to 10° and the sum of frequencies in the range of 0° to 10° is 35% or more to the total frequencies in the inclination angle frequency distribution, the inclination angle frequency distribution being obtained by measuring inclination angles between a direction of the normal line to the surface of the cutting tool body and the normal lines to {100} planes as a crystal plane of the crystal grains, dividing inclination angles belonging to a range of 0° to 45° among the measured inclination angles every pitch of 0.25°, and counting the frequencies in each division, (d) in the direction of the normal line to the surface of the cutting tool body: a periodic composition change of Ti and Al in the composition formula: $(Ti_{1-x}Al_x)(C_yN_{1-y})$ exists in each of the crystal grains with the NaCl type face-centered cubic structure in the complex nitride or carbonitride layer; and a difference $\Delta x$ obtained by subtracting an average of local minimum values from an average of local maximum values of x in the periodic composition change is 0.03 to 0.25, and (e) in the crystal grains with the NaCl type face-centered cubic structure having the periodic composition change of Ti and Al in the complex nitride or carbonitride layer, a period of the periodic composition change in the direction of the normal line to the surface of the cutting tool body is 3 to 100 nm.

(2) The surface-coated cutting tool described in (1), in which, in the crystal grains with the NaCl type face-centered cubic structure having the periodic composition change of Ti and Al in the complex nitride or carbonitride layer: the periodic composition change of Ti and Al is aligned along with a crystal orientation belonging to equivalent crystal orientations expressed by <001> in the crystal grains; a period of the periodic composition change in the crystal orientation is 3 to 100 nm; and the amount of change of the average $X_O$ of content ratio of Al to a total amount of Ti and Al in the plane orthogonal to the crystal orientation is 0.01 or less.

(3) The surface-coated cutting tool described in (1) or (2), in which, in a case where a lattice constant, a, of the crystal grains with the NaCl type face-centered cubic structure is obtained in the complex nitride or carbonitride layer from X-ray diffraction, the lattice constant a satisfies a relationship, $0.05a_{TiN}+0.95a_{AlN} \leq a \leq 0.4a_{TiN}+0.6a_{AlN}$, in which $a_{TiN}$ is a lattice constant of a cubic TiN and $a_{AlN}$ is a lattice constant of a cubic AlN.

(4) The surface-coated cutting tool described in any one of (1) to (3), in which, in a case where the complex nitride or carbonitride layer is observed from the vertical section direction: the complex nitride or carbonitride layer has a columnar structure in which the crystal grains with the NaCl type face-centered cubic structure has an average grain width W of 0.1 to 2.0 µm and an average aspect ratio A of 2 to 10.

(5) The surface-coated cutting tool described in any one of (1) to (4), in which, in the complex nitride or carbonitride layer, an area ratio of Ti and Al complex nitride or carbonitride with the NaCl type face-centered cubic structure is 70% or more.

(6) The surface-coated cutting tool described in any one of (1) to (5), further comprising a lower layer between the cutting tool body and the Ti and Al complex nitride or carbonitride layer, in which the lower layer includes a Ti compound layer, which is made of one or more layers selected from a group consisting of a Ti carbide layer; a Ti nitride layer; a Ti carbonitride layer; a Ti oxycarbide layer; and a Ti oxycarbonitride layer, and has an average total layer thickness of 0.1 to 20 µm.

(7) The surface-coated cutting tool described in any one of (1) to (6), further comprising an upper layer in an upper part of the complex nitride or carbonitride layer, in which the upper layer includes at least an aluminum oxide layer with an average layer thickness of 1 to 25 µm.

(8) The surface-coated cutting tool described in any one of (1) to (7), in which the complex nitride or carbonitride layer is formed by a chemical vapor deposition method in which at least trimethyl aluminum is used as a reaction gas component.

(9) A method for producing a surface-coated cutting tool; the method comprising: a first step of supplying a first gas group including $NH_3$ and $H_2$ for a predetermined supply time; and a second step of supplying a second gas group including $TiCl_4$, $Al(CH_3)_3$, $AlCl_3$, $NH_3$, $N_2$, and $H_2$ for a predetermined supply time, which is started after start of the first step by a shorter time than the supply time of the first step, in which by repeating the first step and the second step with a predetermined period longer than both of the supply time of the first step and the second step, a hard coating layer is formed by chemical vapor deposition on a surface of a cutting tool body made of any one of tungsten carbide-based cemented carbide, titanium carbonitride-based cermet, and cubic boron nitride-based ultra-high pressure sintered material.

Advantageous Effects of Invention

According to the present invention, in the surface-coated cutting tool in which the hard coating layer is provided on the surface of the cutting tool body, the hard coating layer comprises at least the Ti and Al complex nitride or carbonitride layer, which is formed by a chemical vapor deposition method and has an average layer thickness of 1 to 20 μm, and in a case where the composition of the complex nitride or carbonitride layer is expressed by the composition formula: $(Ti_{1-x}Al_x)(C_yN_{1-y})$, the average content ratio $X_{avg}$, which is the ratio of Al to the total amount of Ti and Al and the average content ratio $Y_{avg}$, which is the ratio of C to the total amount of C and N satisfy $0.60 \leq X_{avg} \leq 0.95$ and $0 \leq Y_{avg} \leq 0.005$, provided that each of $X_{avg}$ and $Y_{avg}$ is in atomic ratio. In addition, crystal grains with the cubic structure (NaCl type face-centered cubic structure) exist in the crystal grains constituting the complex nitride or carbonitride layer, and in a case where the crystal orientation of each of the crystal grains is analyzed from the vertical section direction using an electron backscatter diffraction apparatus, in an inclination angle frequency distribution, the highest peak exists in an inclination angle division in a range of 0° to 10° and the sum of frequencies in the range of 0° to 10° is 35% or more to the total frequencies in the inclination angle frequency distribution, the inclination angle frequency distribution being obtained by measuring inclination angles between the direction of the normal line to the surface of the cutting tool body and the normal lines to {100} planes as the crystal plane of the crystal grains, dividing inclination angles belonging to a range of 0° to 45° with respect to the direction of the normal line among the measured inclination angles every pitch of 0.25°, and counting the frequencies in each division. In addition, in the direction of the normal line to the surface of the cutting tool body, a periodic composition change of Ti and Al in the composition formula: $(Ti_{1-x}Al_x)(C_yN_{1-y})$ exists in each of the crystal grains with the cubic structure in the complex nitride or carbonitride layer, the difference obtained by subtracting the average of local minimum values from the average of local maximum values of x in the periodic composition change is 0.03 to 0.25, and the period of the composition change is 3 to 100 nm. Since the surface-coated cutting tool of the present invention has a configuration unique to the present invention, strain occurs in the crystal grains with the cubic structure in the complex nitride or carbonitride layer. Therefore, the hardness of the crystal grains is improved, and toughness is improved while high wear resistance is maintained. As a result, the effect of improving the chipping resistance of the hard coating layer including the complex nitride or carbonitride layer is exhibited, and excellent cutting performance is exhibited for long-term usage compared to a conventional hard coating layer. Therefore, an increase in the tool life of the coated tool is achieved by coating the cutting tool body with the hard coating layer.

DETAILED DESCRIPTION OF THE INVENTION

An embodiment of the present invention will be described below in detail. A coated tool of the present embodiment includes: a cutting tool body made of any one of tungsten carbide-based cemented carbide, titanium carbonitride-based cermet, and cubic boron nitride-based ultra-high pressure sintered material; and a hard coating layer provided on the surface of the cutting tool body. The hard coating layer has the following configuration.

Figure 2:
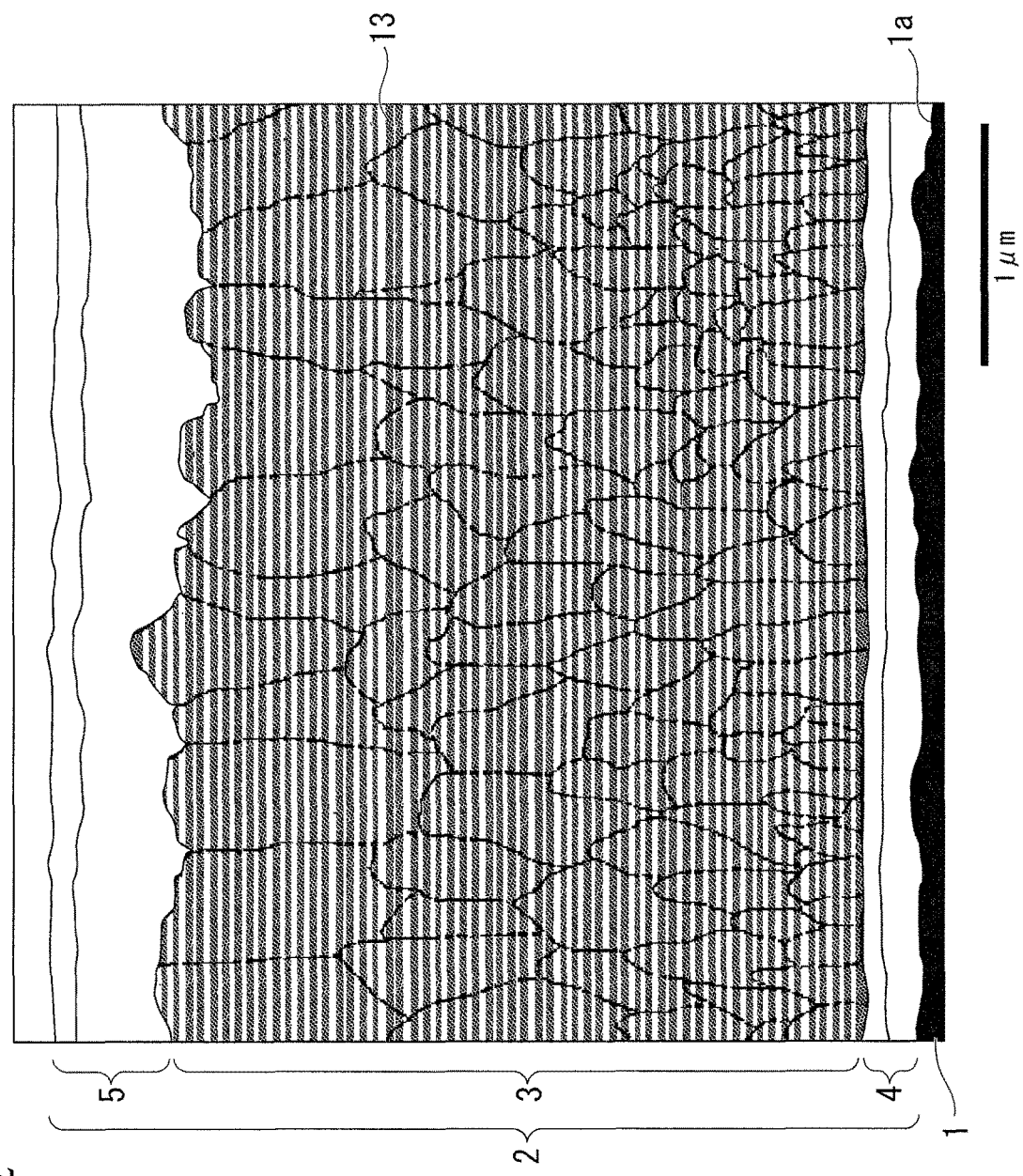
FIG. 2 is a film configuration schematic view schematically showing the section of a Ti and Al complex nitride or carbonitride layer included in a hard coating layer of the present invention.

Average Layer Thickness of Complex Nitride or Carbonitride Layer Included in Hard Coating Layer:

FIG. 2 shows a schematic sectional view of a Ti and Al complex nitride or carbonitride layer 3 included in a hard coating layer 2 of the present embodiment.

The hard coating layer 2 of the present embodiment at least includes the Ti and Al complex nitride or carbonitride layer 3 which is formed through chemical vapor deposition and is expressed by a composition formula: $(Ti_{1-x}Al_x)(C_yN_{1-y})$. In an example of FIG. 2, the hard coating layer includes, in addition to the complex nitride or carbonitride layer 3, a lower layer 4 formed between a surface 1a of a cutting tool body 1 and the complex nitride or carbonitride layer 3, and an upper layer 5 formed on the complex nitride or carbonitride layer 3.

The complex nitride or carbonitride layer 3 has high hardness and excellent wear resistance, and the effect thereof is significantly exhibited particularly when the average layer thickness thereof is 1 to 20 μm. When the average layer thickness thereof is smaller than 1 μm, the layer thickness thereof is too small to sufficiently ensure wear resistance for long-term usage. On the other hand, when the average layer thickness thereof is greater than 20 μm, crystal grains of the Ti and Al complex nitride or carbonitride layer 3 are likely to coarsen, and chipping easily occurs. Therefore, the average layer thickness thereof was determined to be 1 to 20 μm. The average layer thickness thereof is preferably 2 to 10 μm, and more preferably 3 to 5 μm, but is not limited thereto.

Composition of Complex Nitride or Carbonitride Layer Included in Hard Coating Layer:

The complex nitride or carbonitride layer 3 included in the hard coating layer 2 of the present embodiment is controlled such that the average content ratio $X_{avg}$, which is the ratio of Al to the total amount of Ti and Al and the average content ratio $Y_{avg}$, which is the ratio of C to the total amount of C and N satisfy $0.60 \leq X_{avg} \leq 0.95$ and $0 \leq Y_{avg} \leq 0.005$, respectively, provided that each of $X_{avg}$ and $Y_{avg}$ is an atomic ratio.

When the average content ratio $X_{avg}$ of Al is less than 0.60, the oxidation resistance of the Ti and Al complex nitride or carbonitride layer 3 deteriorates, resulting in a reduction in the toughness due to the oxidation of the film. Accordingly, in a case where the layer is provided for high-speed intermittent cutting of alloy steel or the like, the wear resistance thereof is insufficient due to the progress of wear with chipping of the film. On the other hand, when the average content ratio $X_{avg}$ of Al is more than 0.95, the amount of precipitated hexagonal crystals (crystal grains with a wurtzite hexagonal structure) which are inferior in hardness increases, and the hardness decreases, resulting in a reduction in wear resistance. Therefore, the average content ratio $X_{avg}$ of Al was determined to be $0.60 \leq X_{avg} \leq 0.95$. The average content ratio $X_{avg}$ of Al is preferably $0.75 \leq X_{avg} \leq 0.90$, and more preferably $0.80 \leq X_{avg} \leq 0.85$, but is not limited thereto.

In addition, when the average content ratio $Y_{avg}$ of the C component contained in the complex nitride or carbonitride layer 3 is a small amount in a range of $0 \leq Y_{avg} \leq 0.005$, the adhesion between the complex nitride or carbonitride layer 3 and the cutting tool body 1 or the lower layer 4 is improved, and, the lubricity of the complex nitride or carbonitride layer 3 is improved. Accordingly, an impact during cutting is softened, resulting in an improvement in the defect resistance and chipping resistance of the complex nitride or carbonitride layer 3. On the other hand, when the average content ratio $Y_{avg}$ of the C component is outside of the range of $0 \leq Y_{avg} \leq 0.005$, the toughness of the complex nitride or carbonitride layer 3 decreases. Therefore, the defect resistance and chipping resistance, in contrast, decrease, which is not preferable. Therefore, the average content ratio $Y_{avg}$ of C is determined to be $0 \leq Y_{avg} \leq 0.005$. The average content ratio $Y_{avg}$ of C is preferably $0.001 \leq Y_{avg} \leq 0.004$, and more preferably $0.002 \leq Y_{avg} \leq 0.003$, but is not limited thereto. However, the content ratio of C excludes an inevitable content ratio of C which is included even when gas containing C is not intentionally used as a gas raw material. Specifically, the content ratio (atomic ratio) of the C component contained in the complex nitride or carbonitride layer 3 in a case where the amount of supplied $Al(CH_3)_3$ is set to 0 is obtained as the content ratio of inevitable C, and $Y_{avg}$ is a value obtained by subtracting the content ratio of inevitable C from the content ratio (atomic ratio) of the C component contained in the complex nitride or carbonitride layer 3 obtained in a case where $Al(CH_3)_3$ is intentionally supplied.

Cubic Crystal Grains in Complex Nitride or Carbonitride Layer:

The complex nitride or carbonitride layer 3 includes a plurality of crystal grains 13 (hereinafter, may be simply referred to as "cubic crystal grains") with a NaCl type face-centered cubic structure (hereinafter, may be simply referred to as "cubic structure"). Regarding the cubic crystal grains 13, in a case where the grain width thereof in a direction parallel to the cutting tool body surface 1a is referred to as "w", the grain length thereof in a direction perpendicular to the cutting tool body surface 1a is referred to as "l", the ratio l/w between w and l is referred to as the aspect ratio "a" of each crystal grain, the average value of the aspect ratios a obtained for the individual crystal grains is referred to as the average aspect ratio "A", and the average value of the grain widths w obtained for the individual crystal grains is referred to as an average grain width "W", it is preferable that the average grain width W and the average aspect ratio A are controlled to satisfy 0.1 μm to 2.0 μm and 2 to 10, respectively.

When this condition is satisfied, the cubic crystal grains 13 in the complex nitride or carbonitride layer 3 have a columnar structure and exhibit excellent wear resistance. On the other hand, when columnar crystals having an average aspect ratio A of higher than 10 are formed, cracks are likely to propagate on a plane along a periodic composition distribution (a plane along the boundary between a region with a relatively high content of Al and a region with a relatively low content of Al) in a cubic crystal phase (in the cubic crystal grains 13), which is a feature of the present embodiment, and along a plurality of grain boundaries, which is not preferable. The average aspect ratio A is preferably 4 to 6, and more preferably 3 to 8, but is not limited thereto. In addition, when the average grain width W is smaller than 0.1 μm, the wear resistance decreases. When the average grain width W is greater than 2.0 μm, the toughness decreases. Therefore, the average grain width W of the cubic crystal grains 13 in the complex nitride or carbonitride layer 3 is desirably set to 0.1 to 2.0 μm. The average grain width W is preferably 0.2 to 1.5 μm, and more preferably 0.3 to 1.0 μM, but is not limited thereto. In addition, the grain width w is the maximum width of each crystal grain in the direction parallel to the cutting tool body surface 1a, and the grain length l is the maximum length of each crystal grain in the direction perpendicular to the cutting tool body surface 1a.

Inclination Angle Frequency Distribution with Respect to {100} Planes as Crystal Planes of Individual Crystal Grains with Cubic Structure in Ti and Al Complex Nitride or Carbonitride Layer (($Ti_{1-x}Al_x$)($C_yN_{1-y}$) Layer):

Regarding the ($Ti_{1-x}Al_x$)($C_yN_{1-y}$) layer 3 of the present embodiment, analysis of crystal orientations of individual crystal grains 13 with the cubic structure from a vertical section direction thereof using an electron backscatter diffraction apparatus will be described. Here, the analysis using the electron backscatter diffraction apparatus is performed on a section parallel to the layer thickness direction of the ($Ti_{1-x}Al_x$)($C_yN_{1-y}$) layer 3 (the direction perpendicular to the cutting tool body surface 1a). In addition, the vertical section direction is a direction perpendicular to this section, and a section-polished surface, which will be described later, is a surface obtained by polishing the section.

Figure 1A:
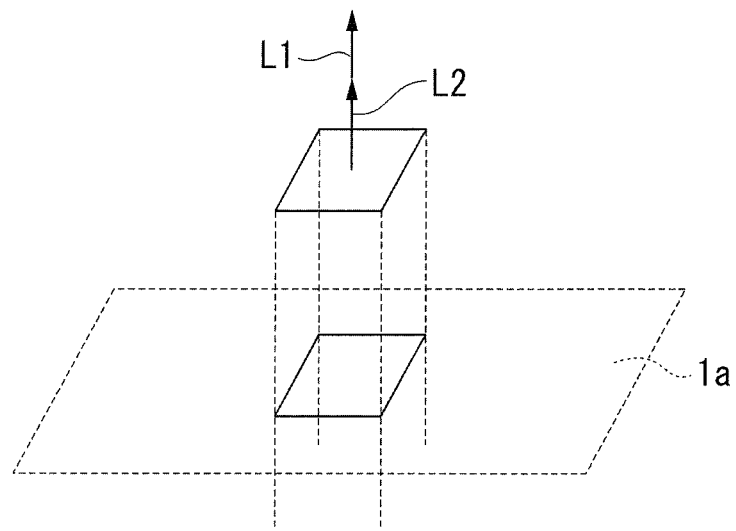
FIG. 1A is a schematic view showing a case where an inclination angle between the normal line to a cutting tool body surface (a direction on a polished section perpendicular to the cutting tool body surface) and the normal line to a {100} plane as a crystal plane of crystal grains is 0°.
Figure 1B:
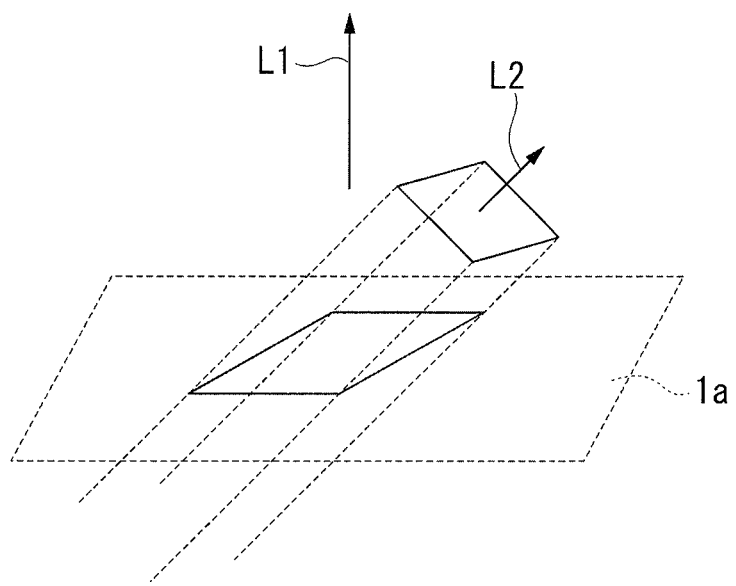
FIG. 1B is a schematic view showing a case where an inclination angle between the normal line to the cutting tool body surface (the direction on the polished section perpendicular to the cutting tool body surface) and the normal line to the {100} plane as the crystal plane of the crystal grains is 45°.

First, inclination angles (see FIGS. 1A and 1B) between the normal line L1 to the cutting tool body surface 1a (the direction perpendicular to the cutting tool body surface 1a on the section-polished surface) and the normal lines L2 to {100} planes as a crystal plane of the crystal grains 13 are measured using the electron backscatter diffraction apparatus. Among the measured inclination angles, inclination angles belonging to a range of 0° to 45° (in a range of 0° of FIG. 1A to 45° of FIG. 1B) with respect to the direction of the normal line L1 are divided every pitch of 0.25°, and the frequencies in each division are counted. The results are plotted on an inclination angle frequency distribution graph (FIGS. 5 and 6) in which the horizontal axis represents the inclination angle divisions and the vertical axis represents the counted frequencies. According to the ($Ti_{1-x}Al_x$)($C_yN_{1-y}$) layer 3 of the present embodiment, the highest peak exists in an inclination angle division in a range of 0° to 10° and the sum of frequencies in the range of 0° to 10° is 35% or more to the total frequencies in the inclination angle frequency distribution (see FIG. 5). In a case where such an inclination angle frequency distribution is obtained, the hard coating layer 2 provided with the Ti and Al complex nitride or carbonitride layer 3 has high hardness while maintaining the cubic structure. Furthermore, due to the obtained inclination angle frequency distribution described above, the adhesion between the hard coating layer 2 and the cutting tool body 1 is dramatically improved.

Therefore, even in a case where the coated tool provided with the hard coating layer 2 is used, for example, for high-speed intermittent cutting of stainless steel or the like, the occurrence of chipping, defect, peeling, and the like is suppressed, and excellent wear resistance is exhibited. In addition, in the inclination angle frequency distribution graph, the sum of frequencies in the range of 0° to 10° is 40% or more to the total frequencies in the inclination angle frequency distribution, and more preferably 45% or more, but is not limited thereto. In addition, the upper limit of the ratio is preferably 85%, and more preferably 80%, but is not limited thereto.

Figure 5:
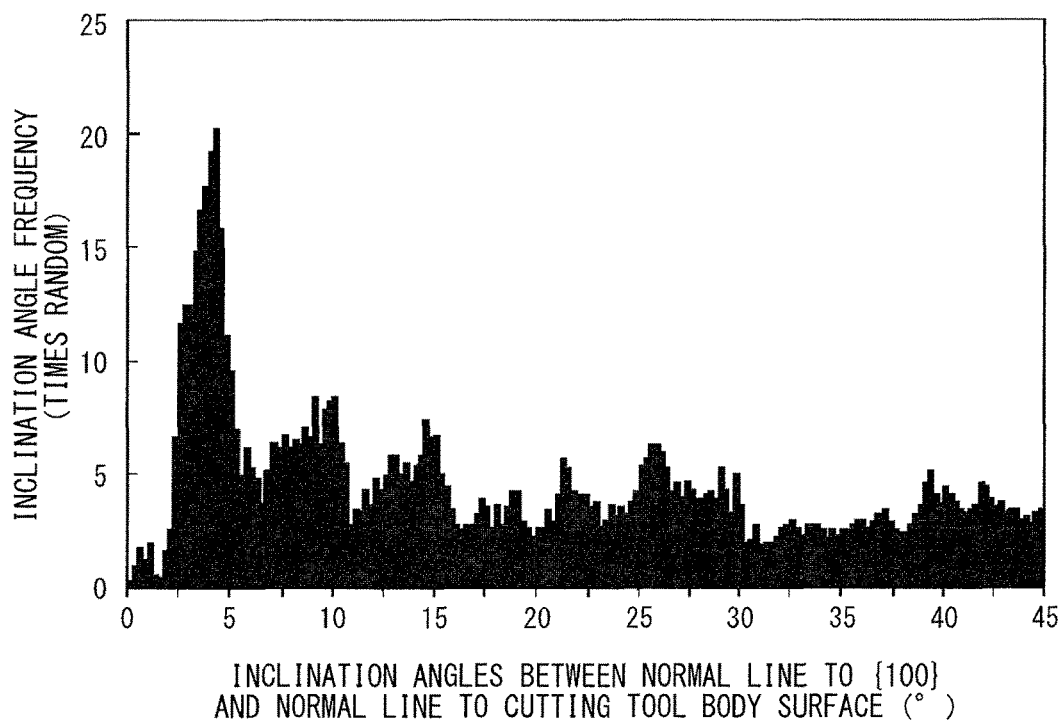
FIG. 5 is a graph showing an example of an inclination angle frequency distribution (pole plot graph) obtained for the crystal grains with the cubic structure in the section of the Ti and Al complex nitride or carbonitride layer included in the hard coating layer of the present invention.
Figure 6:
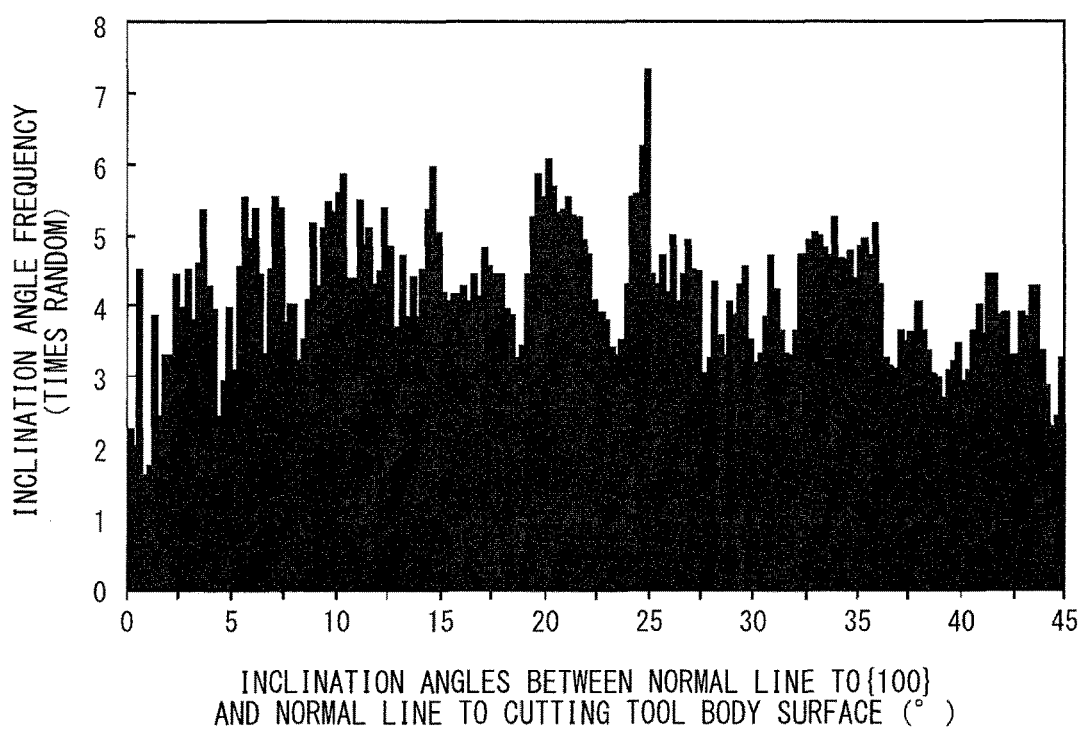
FIG. 6 is a graph showing an example of an inclination angle frequency distribution obtained for crystal grains with a cubic structure in the section of a Ti and Al complex nitride or carbonitride layer included in a hard coating layer as an embodiment of a comparative example.

FIG. 5 shows a graph of an example of an inclination angle frequency distribution obtained by measuring the crystal grains with the cubic structure in the embodiment of the present invention using the above-described method.

Figure 3:
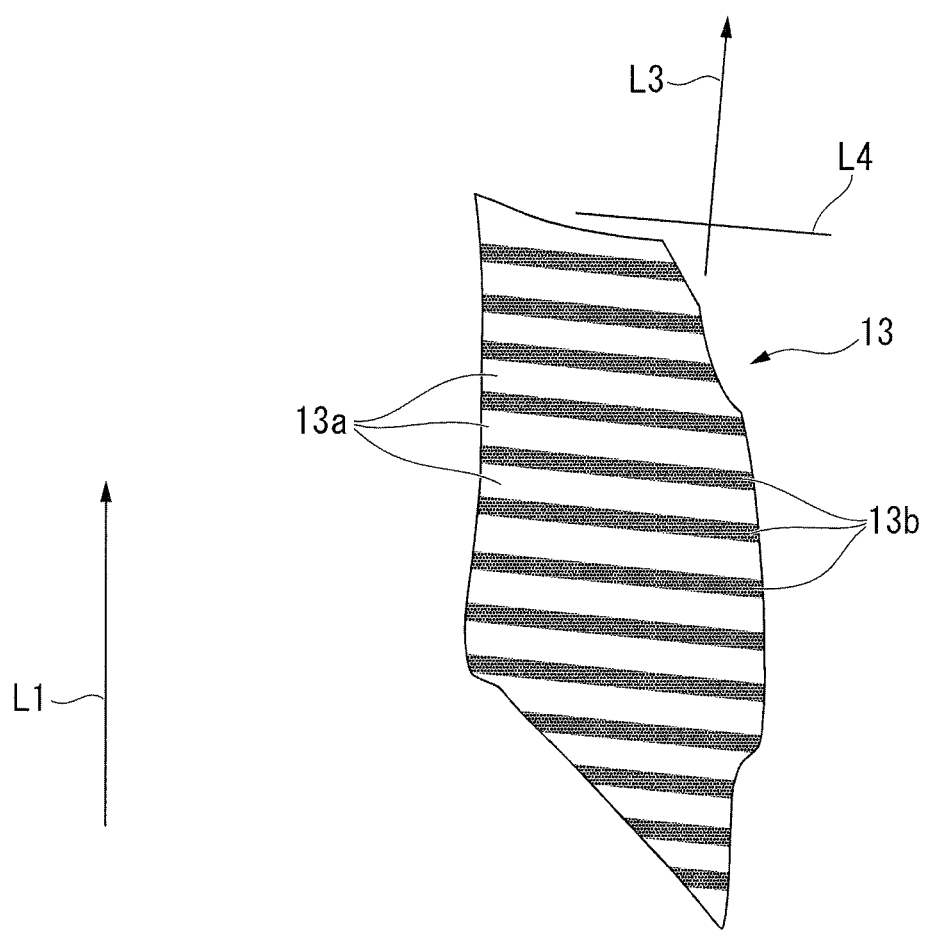
FIG. 3 is a schematic view schematically showing that, in crystal grains with a cubic structure in which the composition of Ti and Al is periodically changed in the section of the Ti and Al complex nitride or carbonitride layer included in the hard coating layer of the present invention, the periodic composition change of Ti and Al is aligned along with a crystal orientation belonging to equivalent crystal orientations expressed by <001> in the crystal grains with the cubic structure, and the periodic composition change of Ti and Al in a plane perpendicular to the crystal orientation is small.

Composition Change of Ti and Al Existing in Crystal Grains with Cubic Structure:

In a case where crystal grains 13 with the cubic structure are expressed by the composition formula: ($Ti_{1-x}Al_x$)($C_yN_{1-y}$), when a periodic composition change of Ti and Al exists in each of the crystal grains (the composition is periodically changed) in the cubic crystal grains 13 of the embodiment as shown in FIG. 3, strain occurs in the cubic crystal grains 13, resulting in an improvement in hardness. More specifically, in the cubic crystal grains 13, a region 13a with a relatively high content x of Al and a region 13b with a relatively low content x of Al are formed to be alternately arranged in the direction of the normal line L1 to the cutting tool body surface 1a. However, when the difference Δx obtained by subtracting the average of local minimum values $x_{min}$ from the average of local maximum values $x_{max}$ of x (atomic ratio) in the composition formula, which is an index of the degree of the composition change of Ti and Al, is smaller than 0.03, the degree of strain in the crystal grains 13 described above is low, and a sufficient improvement in hardness cannot be expected. On the other hand, when the difference obtained by subtracting the average of local minimum values $x_{min}$ from the average of local maximum values $x_{max}$ of x is greater than 0.25, the degree of strain in the crystal grains becomes too high, there are more lattice defects, and hardness decreases. Here, regarding the composition change of Ti and Al existing in the crystal grains with the cubic structure, the difference Δx obtained by subtracting the average of local minimum values from the average of local maximum values of x in the period composition change is set to 0.03 to 0.25. Δx is preferably 0.05 to 0.20, and more preferably 0.06 to 0.15, but is not limited thereto.

Figure 4:
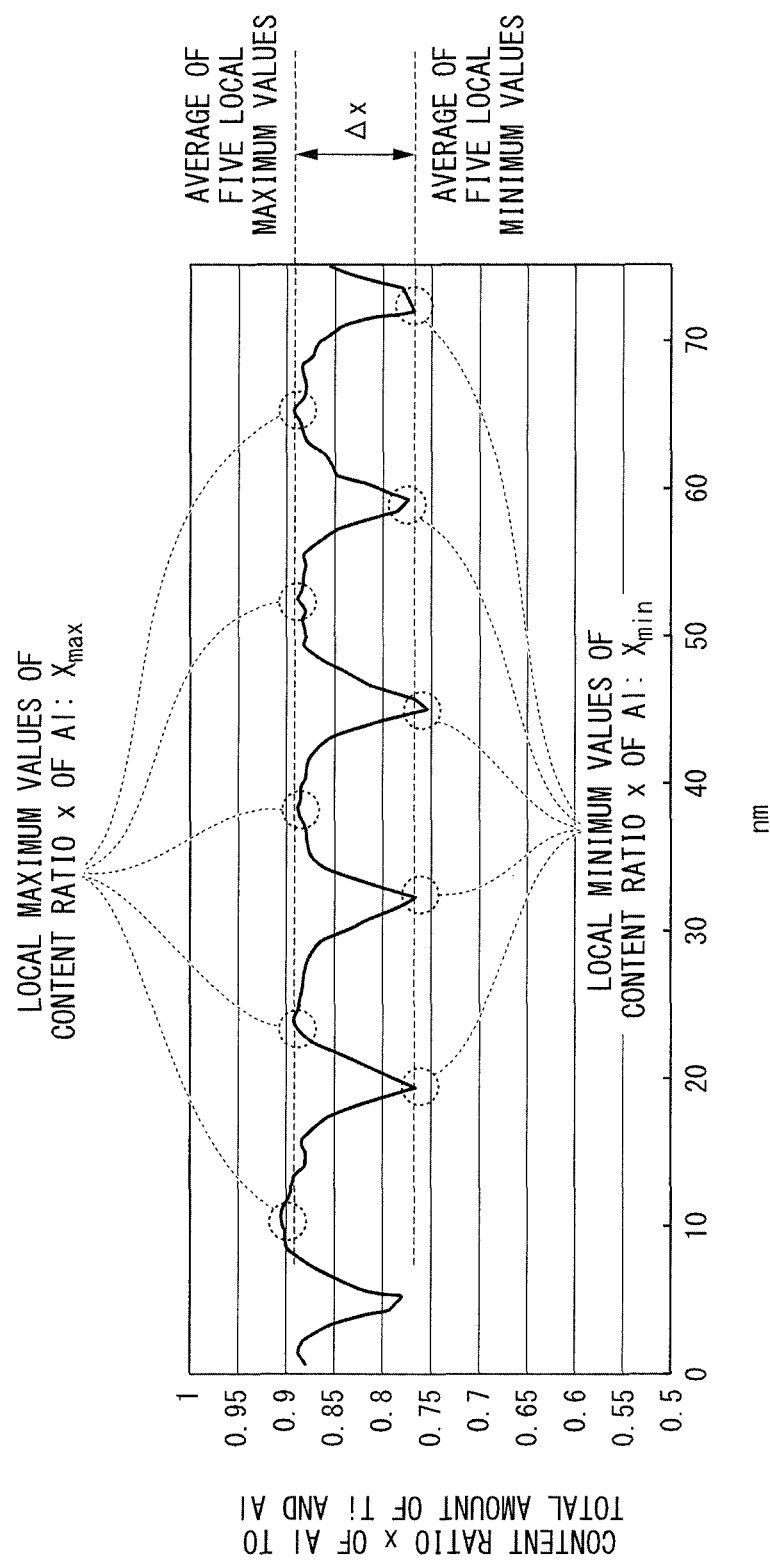
FIG. 4 shows an example of a graph of the periodic composition change (concentration change) x of Ti and Al as a result of line analysis performed by energy-dispersive X-ray spectroscopy (EDS) using a transmission electron microscope on the crystal grains with the cubic structure in which the composition of Ti and Al is periodically changed in the section of the Ti and Al complex nitride or carbonitride layer included in the hard coating layer of the present invention.

In addition, FIG. 4 shows an example of a graph of a periodic composition change of Ti and Al obtained by performing line analysis along the direction of the normal line L1 to the cutting tool body surface 1a through energy-dispersive X-ray spectroscopy (EDS) using a transmission electron microscope regarding the composition change of Ti and Al existing in the crystal grains 13. The horizontal axis represents measurement positions on the normal line L1 (distances from a measurement start position), and the vertical axis represents the content ratio x (atomic ratio) of Al to the total amount of Ti and Al at each position.

Here, the ratio of crystal grains in which the composition of Ti and Al is periodically changed to the cubic crystal grains 13 in the complex nitride or carbonitride layer 3, as the area ratio in the section-polished surface, is preferably 60% or more, and more preferably 80% or more.

In addition, the periodic composition change of Ti and Al preferably has a period of 3 to 100 nm along the direction of the normal line L1 to the tool body surface 1a. When the period is smaller than 3 nm, toughness decreases. On the other hand, when the period is greater than 100 nm, the effect of improving hardness cannot be expected. The period is preferably 5 to 80 nm, and more preferably 10 to 50 nm, but is not limited thereto.

In addition, when the periodic composition change of Ti and Al is aligned with a crystal orientation belonging to equivalent crystal orientations expressed by <001> in the cubic crystal grains, chipping resistance is particularly improved, which is preferable. Furthermore, it is more preferable that the periodic composition change of Ti and Al is aligned with a crystal orientation (L3 of FIG. 3) at the smallest angle with respect to the direction of the normal line L1 to the cutting tool body surface 1a, which belongs to equivalent crystal orientations expressed by <001> in the cubic crystal grains. However, when the period is smaller than 3 nm, toughness decreases. On the other hand, when the period is greater than 100 nm, the effect of improving hardness cannot be expected. Therefore, the period aligned with a crystal orientation belonging to equivalent crystal orientations expressed by <001> in the cubic crystal grains is preferably 3 to 100 nm. The period is preferably 5 to 80 nm, and more preferably 10 to 50 nm, but is not limited thereto.

Furthermore, in the case where the periodic composition change of Ti and Al is aligned with a crystal orientation belonging to equivalent crystal orientations expressed by <001> in the crystal grains, on a plane perpendicular to the <001> orientation L3 aligned with the composition change, a change amount of the average content ratio $X_O$ (atomic ratio) of Al to the total amount of Ti and Ai is preferably 0.01 or lower. More specifically, as shown in FIG. 3, when line analysis is performed along a direction L4 perpendicular to the <001> orientation L3 aligned with the periodic composition change of Ti and Al through energy-dispersive X-ray spectroscopy (EDS), the difference obtained by subtracting the local minimum values from the local maximum values of the average content ratio $X_O$ is preferably 0.01 or less. In this case, an effect of suppressing strain caused by the difference in the composition along the direction L4 can be obtained. The change of $X_O$ is preferably 0.005 or less, and is more preferably absent in a range of the resolution of a detector, but is not limited thereto.

Lattice Constant a of Cubic Crystal Grains in Complex Nitride or Carbonitride Layer:

When the lattice constant a of the cubic crystal grains is obtained by conducting an X-ray diffraction test on the complex nitride or carbonitride layer 3 using an X-ray diffraction apparatus and Cu-Kα X-rays as a radiation source, it is preferable that the lattice constant a of the cubic crystal grains satisfies a relationship of $0.05a_{TiN}+0.95a_{AlN} \leq a \leq 0.4a_{TiN}+0.6a_{AlN}$ for the lattice constant $a_{TiN}$: 4.24173 Å of cubic TiN (JCPDS 00-038-1420) and the lattice constant $a_{AlN}$: 4.045 Å of cubic AlN (JCPDS 00-046-1200). The hard coating layer 2 provided with the complex nitride or carbonitride layer 3 exhibits higher hardness and high thermal conductivity. Therefore, in addition to excellent wear resistance, excellent thermal shock resistance is provided.

Area Ratio of Columnar Structure Constituted by Individual Crystal Grains with Cubic Structure in Complex Nitride or Carbonitride Layer:

It is preferable that the area ratio of the cubic crystal grains 13 in the complex nitride or carbonitride layer 3 is 70% or more. More specifically, it is preferable that in the section-polished surface shown in FIG. 2, the area ratio of the cubic crystal grains 13 is 70% or more. Accordingly, the area ratio of cubic crystal grains with high hardness becomes relatively higher than hexagonal crystal grains, and the effect of improving hardness can be obtained. The area ratio is more preferably 75% or more, but is not limited thereto.

Lower Layer and Upper Layer:

The complex nitride or carbonitride layer 3 of the present embodiment exhibits sufficient effects in itself. However, a lower layer 4 which includes a Ti compound layer, which is made of one or more layers selected from a group consisting of a Ti carbide layer; a Ti nitride layer; a Ti carbonitride layer; a Ti oxycarbide layer; and a Ti oxycarbonitride layer, and has an average total layer thickness of 0.1 to 20 μm may be provided, and/or an upper layer 5 which includes an aluminum oxide layer having an average layer thickness of 1 μm to 25 μm may be provided. In this case, better characteristics can be created together with the effects of these layers.

In a case where the lower layer 4 which includes a Ti compound layer, which is made of one or more layers selected from a group consisting of a Ti carbide layer; a Ti nitride layer; a Ti carbonitride layer; a Ti oxycarbide layer; and a Ti oxycarbonitride layer is provided, an effect of exhibiting high wear resistance can be obtained by setting the average total layer thickness to be 0.1 μm to 20 μm. When the average total layer thickness of the lower layer 4 is smaller than 0.1 μm, the effect of the lower layer 4 is insufficiently exhibited. On the other hand, when the average total layer thickness is greater than 20 μm, the crystal grains easily coarsen and chipping easily occurs. In addition, when the average total layer thickness of the lower layer 4 is preferably 0.2 to 10 μm, and more preferably 0.3 to 5 μm, but is not limited thereto.

In addition, in a case where the upper layer 5 including an aluminum oxide layer is provided, an effect of improving oxidation resistance can be obtained by causing the layer thickness of the aluminum oxide layer to be 1 to 25 μm. When the average layer thickness of the oxide aluminum layer of the upper layer 5 is smaller than 1 μm, the effect of the upper layer 5 is insufficiently exhibited. On the other hand, when the average layer thickness is greater than 25 μm, the crystal grains easily coarsen and chipping easily occurs. In addition, when the average layer thickness of the aluminum oxide layer of the upper layer 5 is preferably 2 to 15 μm, and more preferably 3 to 10 μm, but is not limited thereto.

The hard coating layer 2 including the Ti and Al complex nitride or carbonitride layer 3 of the present embodiment may be formed by a chemical vapor deposition method in which at least trimethyl aluminum is used as a reaction gas component.

More specifically, by repeating a first step of supplying a gas group A (first gas group) including $NH_3$ and $H_2$ for a predetermined supply time, and a second step of supplying a gas group B (second gas group) including $TiCl_4$, $Al(CH_3)_3$, $AlCl_3$, $NH_3$, $N_2$, and $H_2$ for the supply time, which is started after start of the first step by a shorter time than the supply time of the first step, with a predetermined period, the complex nitride or carbonitride layer 3 constituted by the cubic crystal grains in which the composition of Ti and Al is periodically changed in the crystal grains can be formed through chemical vapor deposition.

At this time, by setting the composition of the reaction gas (% by volume with respect to the total amount of the gas group A and the gas group B) so as to include $NH_3$: 2.0% to 3.0%, $H_2$: 65% to 75%, $AlCl_3$: 0.6% to 0.9%, $TiCl_4$: 0.2% to 0.3%, $Al(CH_3)_3$: 0% to 0.5%, $N_2$: 0.0% to 12.0%, and $H_2$: the balance, and setting the reaction atmosphere temperature to 700° C. to 900° C., crystal grains in which angles between the direction of the normal line L1 to the cutting tool body surface and the normal line L2 to the {001} plane are in a range of 0° to 10° can be formed in a larger proportion (the degree of orientation along {001} can be increased). In addition, it is preferable that the reaction atmosphere pressure is set to 4.5 to 5.0 kPa, the supply period (the period for which the first step and the second step are repeated) is set to 1 to 5 seconds, the gas supply time per one period (gas supply time in the first step and the second step) is set to 0.15 to 0.25 seconds, and the phase difference between the supply of the gas group A and the supply of the gas group B (the difference between the start times of the first step and the second step) is set to 0.10 to 0.20 seconds. FIG. 2 shows a schematic view of the section of the hard coating layer 2 including the Ti and Al complex nitride or carbonitride layer 3, the lower layer 4, and the upper layer 5 as the hard coating layer 2 of the present embodiment.

EXAMPLES

Next, Examples of the coated tool of the present embodiment will be described in detail.

Example 1

As raw material powders, a WC powder, a TiC powder, a TaC powder, an NbC powder, a $Cr_3C_2$ powder, and a Co powder, all of which had an average particle diameter of 1 µm to 3 µm, were prepared, and the raw material powders were mixed in mixing compositions shown in Table 1. Wax was further added thereto, and the resultant was blended in acetone by a ball mill for 24 hours and was decompressed and dried. Thereafter, the resultant was press-formed into a compact having a predetermined shape at a pressure of 98 MPa, and the compact was sintered in a vacuum at 5 Pa under the condition where the compact was held at a predetermined temperature in a range of 1370° C. to 1470° C. for one hour. After the sintering, each of cutting tool bodies A to C made of WC-based cemented carbide with an insert shape according to ISO standard SEEN1203AFSN was produced.

In addition, as raw material powders, a TiCN (TiC/TiN=50/50 in terms of mass ratio) powder, an $Mo_2C$ powder, a ZrC powder, an NbC powder, a WC powder, a Co powder, and an Ni powder, all of which had an average particle diameter of 0.5 µm to 2 µm, were prepared, and the raw material powders were mixed in mixing compositions shown in Table 2. The mixture was subjected to wet mixing by a ball mill for 24 hours, and was dried. Thereafter, the resultant was press-formed into a compact at a pressure of 98 MPa, and the compact was sintered in a nitrogen atmosphere at 1.3 kPa under the condition where the compact was held at a temperature of 1500° C. for one hour. After the sintering, a cutting tool body D made of TiCN-based cermet with an insert shape according to ISO standard SEEN1203AFSN was produced.

Next, invention coated tools 1 to 15 were produced by forming $(Ti_{1-x}Al_x)(C_yN_{1-y})$ layers on the surfaces of the cutting tool bodies A to D using a chemical vapor deposition apparatus under the forming conditions A to J shown in Table 4. That is, the composition of the gas group A including $NH_3$ and $H_2$, the composition of the gas group B including $TiCl_4$, $Al(CH_3)_3$, $AlCl_3$, $NH_3$, $N_2$, and $H_2$, and a method for supplying the gas group A and the gas group B were set under the conditions shown in Table 4. The composition of a reaction gas (% by volume with respect to the total amount of the gas group A and the gas group B) included, as the gas group A, $NH_3$: 2.0% to 3.0% and $H_2$: 65% to 75%, and as the gas group B, $AlCl_3$: 0.6% to 0.9%, $TiCl_4$: 0.2% to 0.3%, $Al(CH_3)_3$: 0% to 0.5%, $N_2$: 0.0% to 12.0%, $H_2$: the balance. In addition, a thermal CVD method was performed for a predetermined time under a reaction atmosphere pressure of 4.5 to 5.0 kPa, at a reaction atmosphere temperature of 700° C. to 900° C., with a supply period of 1 to 5 seconds, for a gas supply time of 0.15 to 0.25 seconds per one period, with a phase difference between gas supply A and gas supply B of 0.10 to 0.20 seconds. Accordingly, the $(Ti_{1-x}Al_x)(C_yN_{1-y})$ layer with a granular structure having the average grain width W and the average aspect ratio A shown in Table 6 was formed, thereby obtaining the invention coated tools 1 to 15.

In addition, in the invention coated tools 6 to 13, in addition to the $(Ti_{1-x}Al_x)(C_yN_{1-y})$ layer, a lower layer shown in Table 5 and/or an upper layer shown in Table 6 was formed under the forming conditions shown in Table 3.

A section of the hard coating layer of the invention coated tools 1 to 15, which was perpendicular to the cutting tool body surface, was observed over a plurality of visual fields using an electron scanning microscope (at a magnification of 5,000-fold and 20,000-fold). As a result, it was confirmed that the area ratio of crystal grains with a cubic structure in the Ti and Al complex nitride or carbonitride layer included in the hard coating layer was 70% or more. In addition, a method of measuring the area ratio of crystal grains with a cubic structure will be described later.

In addition, by performing plane analysis on the section described above through energy-dispersive X-ray spectroscopy (EDS) using a transmission electron microscope (a magnification of 200,000-fold), it was confirmed that a periodic composition change of Ti and Al existed in the cubic crystal grains. As a result of further performing line analysis for five periods of the composition change along the direction of the normal line to the cutting tool body surface, it was confirmed that the difference obtained by subtracting the average of local minimum values from the average of local maximum values in the periodic composition change of Ti and Al, that is, the difference obtained by subtracting the average of local minimum values from the average of local maximum values of the content ratio x of Al to the total amount of Ti and Al was 0.03 to 0.25. Details of methods of plane analysis and line analysis through EDS will be described later.

In addition, for the purpose of comparison, like the invention coated tools 1 to 15, hard coating layers including at least a Ti and Al complex nitride or carbonitride layer were deposited on the surfaces of the cutting tool bodies A to D to have target layer thicknesses (µm) shown in Table 7 under conditions shown in Table 3 and conditions of comparative film forming steps shown in Table 4, thereby producing comparative coated tools 1 to 13. During the film forming step of the $(Ti_{1-x}Al_x)(C_yN_{1-y})$ layer of the comparative coated tools 1 to 13, as shown in Table 4, by forming the hard coating layers so as not to cause the composition of the reaction gas on the cutting tool body surface to be changed over time, the comparative coated tools 1 to 13 were produced.

In addition, like the invention coated tools 6 to 13, in the comparative coated tools 6 to 13, a lower layer shown in Table 5 and/or an upper layer shown in Table 7 was formed under the forming conditions shown in Table 3.

For reference, reference coated tools 14 and 15 shown in Table 7 were produced by depositing $(Ti_{1-x}Al_x)(C_yN_{1-y})$ layers of a reference example on the surfaces of the cutting tool body B and the cutting tool body C to have target layer thicknesses through arc ion plating using a conventional physical vapor deposition apparatus.

In addition, conditions of the arc ion plating using the deposition in the reference example are as follows.

(a) The cutting tool bodies B and C were subjected to ultrasonic cleaning in acetone and were dried. In this state, the cutting tool bodies B and C were mounted along outer circumferential portions on a rotating table in an arc ion plating apparatus at positions distant from the center axis on the rotating table by predetermined distances in a radial direction thereof. In addition, an Al—Ti alloy having a predetermined composition was disposed outside the rotating table as a cathode electrode (evaporation source).

(b) First, while the inside of the apparatus was evacuated and maintained in a vacuum at $10^{-2}$ Pa or lower, the inside of the apparatus was heated to 500° C. by a heater. Thereafter, a DC bias voltage of −1000 V was applied to the cutting tool body that was rotated while being revolved on the rotating table. In addition, arc discharge was generated by allowing a current of 200 A to flow between the cathode electrode made of the Al—Ti alloy and an anode electrode such that Al and Ti ions were generated in the apparatus. Accordingly, the cutting tool body surface was subjected to bombardment.

(c) Next, nitrogen gas as a reaction gas was introduced into the apparatus to form a reaction atmosphere at 4 Pa, and a DC bias voltage of −50 V was applied to the cutting tool body that was rotated while being revolved on the rotating table. In addition, arc discharge was generated by allowing a current of 120 A to flow between the cathode electrode (evaporation source) made of the Al—Ti alloy and the anode electrode. Accordingly, a (Ti,Al)N layer having a target composition and a target layer thickness shown in Table 7 was deposited on the surface of the cutting tool body, thereby producing the reference coated tools 14 and 15. In addition, in Table 7, "AIP" in the column of the formation symbol of TiAlCN film forming step of the reference coated tools 14 and 15 indicates film formation through arc ion plating.

The section of each of constituent layers of the invention coated tools 1 to 15, the comparative coated tools 1 to 13, and the reference coated tools 14 and 15, which was perpendicular to the cutting tool body, was observed using an electron scanning microscope (at a magnification of 5,000-fold) over a plurality of visual fields. Regarding the Ti and Al complex nitride or carbonitride layer, an average layer thickness was obtained by measuring the layer thicknesses of five points in an observation visual field and averaging the obtained layer thicknesses. As a result, all the layers showed substantially the same average layer thicknesses as the target layer thicknesses shown in Tables 6 and 7. In addition, the average layer thicknesses of the lower layer and the upper layer were obtained in the same manner. As a result, all the layers showed substantially the same average layer thicknesses as the average target layer thicknesses shown in Tables 5 to 7.

In addition, the average content ratio $X_{avg}$ of Al of the complex nitride or carbonitride layer was measured using an electron probe micro-analyzer (EPMA). A sample, of which the surface (section in the direction perpendicular to the cutting tool body) was polished, was irradiated with electron beams from the sample surface side, and from the analytic results of the obtained characteristic X-rays, the content ratio of Al to the total amount of Ti and Al was obtained. The average content ratio $X_{avg}$ of Al was obtained by averaging the content ratios of Al at 10 points. The results are shown in Tables 6 and 7.

The average content ratio $Y_{avg}$ of C was obtained by secondary ion mass spectrometry (SIMS). Ion beams were emitted toward a range of 70 μm×70 μm from the sample surface side, and the concentration of components emitted by a sputtering action was measured in a depth direction (a direction perpendicular to the sample surface). The results are shown in Tables 6 and 7.

In Tables 6 and 7, the average content ratio $Y_{avg}$ of C represents the average value in the depth direction of the Ti and Al complex nitride or carbonitride layer. In addition, the measurement of the concentration was performed in a range from a depth at which the body component was detected to a depth at which the film component was not detected. The average value in the depth direction was the average of concentrations measured at a ¼ depth, a 2/4 (½) depth, and a ¾ depth as depths quartered from the film thickness. However, the average content ratio $Y_{avg}$ of C in Tables 6 and 7 is a value excluding the content ratio of inevitable C, which is included even though gas containing C is not intentionally used as a gas raw material. Specifically, the content ratio (in terms of atomic ratio) of the C component contained in the complex nitride or carbonitride layer in a case where the amount of supplied $Al(CH_3)_3$ was set to 0 was obtained as the content ratio of inevitable C, and a value obtained by subtracting the content ratio of inevitable C from the content ratio (in terms of atomic ratio) of the C component contained in the complex nitride or carbonitride layer obtained in a case where $Al(CH_3)_3$ was intentionally supplied (the invention coated tools 1 to 15 and the comparative coated tools 1 to 13) was obtained as the average content ratio $Y_{avg}$ of C.

In addition, regarding the invention coated tools 1 to 15, the comparative coated tools 1 to 13, and the reference coated tools 14 and 15, a section perpendicular to the cutting tool body was observed using an electron scanning microscope (at a magnification of 5,000-fold and 20,000-fold), and the average width W and the average aspect ratio A of the cubic crystal grains in the complex nitride or carbonitride layer were obtained. Specifically, regarding the individual crystal grains which were present in a range at a length of 10 μm in a direction parallel to the cutting tool body surface and had a cubic structure in the complex nitride or carbonitride layer (($Ti_{1-x}Al_x$)($C_yN_{1-y}$) layer), grain widths w in the direction parallel to the tool body surface and grain lengths l in the direction perpendicular to the tool body surface were measured. The aspect ratio a(=l/w) of each of the crystal grains was calculated, the average value of the aspect ratios a obtained for the individual crystal grains was calculated as an average aspect ratio A, and the average value of the grain widths w obtained for the individual crystal grains was calculated as an average grain width W. In addition, the grain width w is the maximum width of each crystal grain in the direction parallel to the cutting tool body surface, and the grain length l is the maximum length of each crystal grain in the direction perpendicular to the cutting tool body surface 1a. The results are shown in Tables 6 and 7.

In addition, an inclination angle frequency distribution in the complex nitride or carbonitride layer of the hard coating layer was obtained as follows. First, in a state where the section of the hard coating layer including the Ti and Al complex nitride or carbonitride layer with the cubic structure, which was perpendicular to the cutting tool body surface, was polished as a polished surface, the polished surface was set in the lens tube of a field emission electron scanning microscope. Next, an electron beam at an acceleration voltage of 15 kV and an incident angle of 70° with respect to the polished surface (section-polished surface) was emitted toward each of the crystal grains with a cubic crystal lattice, which were present in a measurement range of the section-polished surface, with an emission current of 1 nA at an interval of 0.01 μm/step. The measurement range was a range with a length of 100 μm in the direction parallel to the cutting tool body surface and with a sufficient length for a film thickness in the direction perpendicular to the cutting tool body surface. On the basis of an electron backscatter diffraction pattern obtained by emitting an electron beam at an interval of 0.01 μm/step, inclination angles of normal lines of {100} planes which were crystal planes of the crystal grains with respect to the normal line to the tool body surface (the direction perpendicular to the tool body surface in the section-polished surface) were measured using an electron backscatter diffraction imaging device at each measurement point (a point irradiated with the electron beam). In addition, on the basis of the measurement results, an inclination angle frequency distribution was obtained by dividing inclination angles belonging to a range of 0° to 45° among the measured inclination angles every pitch of 0.25°, and counting the frequencies in each division. The presence or absence of the highest peak of frequencies in a range of 0° to 10° was checked from the obtained inclination angle frequency distribution, and the ratio of the frequencies in the range of 0° to 10° to the frequencies in the range of 0° to 45°

(the total frequencies in the inclination angle frequency distribution) was obtained. The results are also shown in Tables 6 and 7.

In addition, the area ratio of the crystal grains with the cubic structure in the Ti and Al complex nitride or carbonitride layer was obtained as follows. First, in a state where the section of the hard coating layer including the Ti and Al complex nitride or carbonitride layer, which was perpendicular to the cutting tool body surface, was polished as a polished surface using the electron backscatter diffraction apparatus, the polished surface was set in the lens tube of the field emission electron scanning microscope. Next, an electron beam at an acceleration voltage of 15 kV and an incident angle of 70 degrees with respect to the section-polished surface was emitted toward each of the crystal grains which were present in the measurement range of the section-polished surface with an emission current of 1 nA at an interval of 0.01 µm/step. The measurement range was a range with for a length of 100 µm in the direction parallel to the cutting tool body and with a sufficient length for a film thickness in the direction perpendicular to the cutting tool body surface. Using the electron backscatter diffraction imaging device, an electron backscatter diffraction pattern was measured by emitting an electron beam at an interval of 0.01 µm/step. By analyzing the crystal structure of each of the crystal grains on the basis of the obtained electron backscatter diffraction patterns, the area ratio of the crystal grains with the cubic structure in the measurement region was obtained. The results are also shown in Tables 6 and 7.

Furthermore, a small region of the complex nitride or carbonitride layer was observed by using a transmission electron microscope (at a magnification of 200,000-fold). Plane analysis of the section perpendicular to the cutting tool body surface was performed using energy-dispersive X-ray spectroscopy (EDS). The plane analysis was performed on a region of 400 nm×400 nm. As a result, it was confirmed that a periodic composition change of Ti and Al in the composition formula: $(Ti_{1-x}Al_x)(C_yN_{1-y})$ exists in each of the crystal grains with the cubic structure. That is, in an image obtained as a result of the plane analysis, as schematically shown in FIG. 3, a streaky change in color concentration in the crystal grains with the cubic structure was seen. Regarding the crystal grains where such a composition change was seen, on the basis of the results of the plane analysis, a magnification was set such that the composition change of about 10 periods based on the concentration of the composition belonged to the measurement range. Thereafter, line analysis was performed on a range of five periods along the direction normal to the cutting tool body surface through EDS. The difference $\Delta x$ obtained by subtracting the average of local minimum values from the average of local maximum values in the periodic change of the content ratio x of Al to the total amount of Ti and Al was obtained, and the average interval between the local maximum values of the five periods was obtained as the period of the periodic composition change of Ti and Al. The results are shown in Tables 6 and 7.

Electron beam diffraction was performed on the crystal grains. As a result, regarding a sample having crystal grains in which it was confirmed that the periodic composition change of Ti and Al was aligned with a crystal orientation belonging to equivalent crystal orientations expressed by <001> in the cubic crystal grains, line analysis along the crystal orientation through EDS was performed on a range of five periods. In addition, the local maximum values and the local minimum values of the periodic change of the content ratio x of Al to the total amount of Ti and Al were obtained, and the average interval of five periods of the local maximum values was obtained as the period of the periodic change of the content ratio x of Al to the total amount of Ti and Al. In addition, line analysis along a direction perpendicular to the crystal orientation was performed, and the difference obtained by subtracting the local minimum values from the local maximum values of the average of the content ratio of Al to the total amount of Ti and Al was obtained as the composition change (in-plane composition change $X_O$) of Ti and Al in a plane perpendicular to the direction. In addition, the line analysis was performed on the same range similar to the line analysis along the direction normal to the tool body surface. The results are shown in Tables 6 and 7.

An X-ray diffraction test was conducted on the section of the complex nitride or carbonitride layer, which was perpendicular to the cutting tool body surface, using an X-ray diffraction apparatus by emitting X-rays using Cu-Kα X-rays as a radiation source. From the obtained X-ray diffraction data, the lattice constant a of the cubic crystal grains was obtained. The results are shown in Tables 6 and 7.

TABLE 1

| Type | | Co | TiC | TaC | NbC | $Cr_3C_2$ | WC |
|---|---|---|---|---|---|---|---|
| Cutting | A | 8.0 | 1.5 | — | 3.0 | 0.4 | Balance |
| tool | B | 8.5 | — | 1.8 | 0.2 | — | Balance |
| body | C | 7.0 | — | — | — | — | Balance |

Mixing composition (mass %)

TABLE 2

| Type | | Co | Ni | ZrC | NbC | $Mo_2C$ | WC | TiCN |
|---|---|---|---|---|---|---|---|---|
| Cutting tool body | D | 8 | 5 | 1 | 6 | 6 | 10 | Balance |

Mixing composition (mass %)

TABLE 3

| Constituent layers of hard coating layer | | | Forming conditions (pressure of reaction atmosphere is expressed as kPa and temperature is expressed as ° C.) | | |
|---|---|---|---|---|---|
| Type | | Formation symbol | Reaction gas composition (% by volume) | Pressure | Temperature |
| $(Ti_{1-x}Al_x)(C_yN_{1-y})$ layer | TiAlCN | TiAlCN | See Table 4 | See Table 4 | See Table 4 |
| Ti compound | TiC | TiC | $TiCl_4$: 4.2%, $CH_4$: 8.5%, $H_2$: balance | 7 | 1020 |
| | TiN | TiN-① | $TiCl_4$: 4.2%, $N_2$: 30%, $H_2$: balance | 30 | 900 |

TABLE 3-continued

| Constituent layers of hard coating layer | | | Forming conditions (pressure of reaction atmosphere is expressed as kPa and temperature is expressed as ° C.) | | |
|---|---|---|---|---|---|
| Type | | Formation symbol | Reaction gas composition (% by volume) | Reaction atmosphere | |
| | | | | Pressure | Temperature |
| layer | | TiN-② | $TiCl_4$: 4.2%, $N_2$: 35%, $H_2$: balance | 50 | 1040 |
| | | TiN-③ | $TiCl_4$: 4.2%, $N_2$: 30%, $H_2$: balance | 30 | 780 |
| | 1-TiCN | 1-TiCN-① | $TiCl_4$: 2%, $CH_3CN$: 0.7%, $N_2$: 10%, $H_2$: balance | 7 | 900 |
| | | 1-TiCN-② | $TiCl_4$: 2%, $CH_3CN$: 0.7%, $N_2$: 10%, $H_2$: balance | 7 | 780 |
| | TiCN | TiCN | $TiCl_4$: 2%, $CH_4$: 1%, $N_2$: 15%, $H_2$: balance | 13 | 1000 |
| | TiCO | TiCO | $TiCl_4$: 4.2%, CO: 4%, $H_2$: balance | 7 | 1020 |
| | TiCNO | TiCNO | $TiCl_4$: 2%, CO: 1%, $CH_4$: 1%, $N_2$: 5%, $H_2$: balance | 13 | 1000 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: balance | 7 | 1000 |

TABLE 4

Forming conditions (compositions of reaction gases indicate proportion in total amount of gas group A and gas group B, and pressure of reaction atmosphere is expressed as kPa and temperature is expressed as °C.)

| Step type | Formation symbol | Gas group A Composition (% by volume) | Gas group A Supply period (sec) | Gas group A Supply time per one period (sec) | Gas group B Composition (% by volume) | Gas group B Supply period (sec) | Gas group B Supply time per one period (sec) | Phase difference in supply between gas group A and gas group B (sec) | Reaction atmosphere Pressure | Reaction atmosphere Temperature |
|---|---|---|---|---|---|---|---|---|---|---|
| Invention film forming step | A | NH$_3$; 2.5%, N$_2$; 0.0%, H$_2$; 70%, | 1 | 0.2 | AlCl$_3$; 0.7%, TiCl$_4$; 0.2%, N$_2$; 0%, Al(CH$_3$)$_3$; 0%, H$_2$ as balance | 1 | 0.2 | 0.1 | 4.7 | 800 |
| | B | NH$_3$; 3.0%, N$_2$; 0.0%, H$_2$; 75%, | 3 | 0.15 | AlCl$_3$; 0.7%, TiCl$_4$; 0.3%, N$_2$; 0%, Al(CH$_3$)$_3$; 0%, H$_2$ as balance | 3 | 0.15 | 0.15 | 4.5 | 800 |
| | C | NH$_3$; 2.0%, N$_2$; 0.0%, H$_2$; 65%, | 2 | 0.25 | AlCl$_3$; 0.9%, TiCl$_4$; 0.3%, N$_2$; 0%, Al(CH$_3$)$_3$; 0.5%, H$_2$ as balance | 2 | 0.25 | 0.2 | 5 | 700 |
| | D | NH$_3$; 3.0%, N$_2$; 0.0%, H$_2$; 70%, | 5 | 0.2 | AlCl$_3$; 0.6%, TiCl$_4$; 0.2%, N$_2$; 5%, Al(CH$_3$)$_3$; 0%, H$_2$ as balance | 5 | 0.2 | 0.1 | 4.7 | 800 |
| | E | NH$_3$; 2.0%, N$_2$; 0.0%, H$_2$; 75%, | 4 | 0.2 | AlCl$_3$; 0.8%, TiCl$_4$; 0.3%, N$_2$; 9%, Al(CH$_3$)$_3$; 0%, H$_2$ as balance | 4 | 0.2 | 0.15 | 5 | 850 |
| | F | NH$_3$; 2.5%, N$_2$; 0.0%, H$_2$; 65%, | 2.5 | 0.2 | AlCl$_3$; 0.7%, TiCl$_4$; 0.3%, N$_2$; 10%, Al(CH$_3$)$_3$; 0.2%, H$_2$ as balance | 2.5 | 0.2 | 0.2 | 4.5 | 800 |
| | G | NH$_3$; 2.5%, N$_2$; 0.0%, H$_2$; 70%, | 1.5 | 0.15 | AlCl$_3$; 0.9%, TiCl$_4$; 0.2%, N$_2$; 12%, Al(CH$_3$)$_3$; 0%, H$_2$ as balance | 1.5 | 0.15 | 0.2 | 4.7 | 700 |
| | H | NH$_3$; 2.5%, N$_2$; 0.0%, H$_2$; 70%, | 1.2 | 0.25 | AlCl$_3$; 0.9%, TiCl$_4$; 0.2%, N$_2$; 3%, Al(CH$_3$)$_3$; 0%, H$_2$ as balance | 1.2 | 0.25 | 0.1 | 4.7 | 900 |
| | I | NH$_3$; 2.5%, N$_2$; 0.0%, H$_2$; 70%, | 4.5 | 0.2 | AlCl$_3$; 0.6%, TiCl$_4$; 0.3%, N$_2$; 7%, Al(CH$_3$)$_3$; 0.4%, H$_2$ as balance | 4.5 | 0.2 | 0.15 | 4.7 | 800 |
| | J | NH$_3$; 2.5%, N$_2$; 0.0%, H$_2$; 70%, | 2.5 | 0.2 | AlCl$_3$; 0.8%, TiCl$_4$; 0.3%, N$_2$; 0%, Al(CH$_3$)$_3$; 0.4%, H$_2$ as balance | 2.5 | 0.2 | 0.2 | 4.7 | 750 |
| Comparative film forming step | A' | NH$_3$; 2.5%, N$_2$; 0.0%, H$_2$; 70%, | — | — | AlCl$_3$; 0.7%, TiCl$_4$; 0.2%, N$_2$; 0%, Al(CH$_3$)$_3$; 0%, H$_2$ as balance | — | — | — | 4.7 | 800 |
| | B' | NH$_3$; 3.0%, N$_2$; 0.0%, H$_2$; 75%, | — | — | AlCl$_3$; 0.7%, TiCl$_4$; 0.3%, N$_2$; 0%, Al(CH$_3$)$_3$; 0%, H$_2$ as balance | — | — | — | 4.5 | 800 |
| | C' | NH$_3$; 2.0%, N$_2$; 0.0%, H$_2$; 65%, | — | — | AlCl$_3$; 0.9%, TiCl$_4$; 0.3%, N$_2$; 0%, Al(CH$_3$)$_3$; 0.5%, H$_2$ as balance | — | — | — | 5 | 700 |
| | D' | NH$_3$; 3.0%, N$_2$; 0.0%, H$_2$; 70%, | — | — | AlCl$_3$; 0.6%, TiCl$_4$; 0.2%, N$_2$; 5%, Al(CH$_3$)$_3$; 0%, H$_2$ as balance | — | — | — | 4.7 | 800 |
| | E' | NH$_3$; 2.0%, N$_2$; 0.0%, H$_2$; 75%, | — | — | AlCl$_3$; 0.8%, TiCl$_4$; 0.3%, N$_2$; 9%, Al(CH$_3$)$_3$; 0%, H$_2$ as balance | — | — | — | 5 | 850 |
| | F' | NH$_3$; 2.5%, N$_2$; 0.0%, H$_2$; 65%, | — | — | AlCl$_3$; 0.7%, TiCl$_4$; 0.3%, N$_2$; 10%, Al(CH$_3$)$_3$; 0.2%, H$_2$ as balance | — | — | — | 4.5 | 800 |
| | G' | NH$_3$; 2.5%, N$_2$; 0.0%, H$_2$; 70%, | — | — | AlCl$_3$; 0.9%, TiCl$_4$; 0.2%, N$_2$; 12%, Al(CH$_3$)$_3$; 0%, H$_2$ as balance | — | — | — | 4.7 | 700 |
| | H' | NH$_3$; 2.5%, N$_2$; 0.0%, H$_2$; 70%, | — | — | AlCl$_3$; 0.9%, TiCl$_4$; 0.2%, N$_2$; 3%, Al(CH$_3$)$_3$; 0%, H$_2$ as balance | — | — | — | 4.7 | 900 |
| | I' | NH$_3$; 2.5%, N$_2$; 0.0%, H$_2$; 70%, | — | — | AlCl$_3$; 0.6%, TiCl$_4$; 0.3%, N2; 7%, Al(CH$_3$)$_3$; 0.4%, H$_2$ as balance | — | — | — | 4.7 | 800 |
| | J' | NH$_3$; 2.5%, N$_2$; 0.0%, H$_2$; 70%, | — | — | AlCl$_3$; 0.8%, TiCl$_4$; 0.3%, N$_2$; 0%, Al(CH$_3$)$_3$; 0.4%, H$_2$ as balance | — | — | — | 4.7 | 750 |

TABLE 5

| Type | Cutting tool body symbol | Hard coating layer (numerical value at the bottom indicates target average layer thickness (μm)) Lower layer | | |
|---|---|---|---|---|
| | | First layer | Second layer | Third layer |
| Invention coated tool, Comparative coated tool, Reference coated tool | 1 | A | — | — | — |
| | 2 | B | — | — | — |
| | 3 | C | — | — | — |
| | 4 | D | — | — | — |
| | 5 | A | — | — | — |
| | 6 | B | TiC (0.5) | — | — |
| | 7 | C | TiN-① (0.3) | — | — |
| | 8 | D | TiN-① (0.5) | 1-TiCN-① (4) | — |
| | 9 | A | TiN-① (0.3) | 1-TiCN-① (2) | TiCN (0.7) |
| | 10 | B | — | — | — |
| | 11 | C | TiN-① (0.5) | — | — |
| | 12 | D | TiC (1) | — | — |
| | 13 | A | TiN-① (0.1) | — | — |
| | 14 | B | — | — | — |
| | 15 | C | — | — | — |

TABLE 6

| | | | | Hard coating layer | | | | | | | | | | | | | |
|---|---|---|---|---|---|---|---|---|---|---|---|---|---|---|---|---|---|
| | | | | | Ti and Al complex nitride or carbonitride layer (Ti$_{1-x}$Al$_x$)(C$_y$N$_{1-y}$) | | | | | | | | | | | Upper layer (numerical value at the bottom indicates average target layer thickness (μm)) | |
| Type | Cutting tool body symbol | Formation symbol of TiAlCN film forming step (see Table 4) | Whether or not the highest peak of frequencies of inclination angles between normal line to {100} and normal line to cutting tool body surface exists in range of 0° to 10° | Ratio of frequencies of inclination angles of 0° to 10° between normal line to {100} and normal line to cutting tool body surface (%) | Average content ratio X$_{avg}$ of Al | Average content ratio Y$_{avg}$ of C | Δx | Period along normal line to cutting tool body surface (nm) | Period along <001> (nm) | In-plane composition change X$_O$ | Average grain width W (μm) | Average aspect ratio A | Lattice constant a (Å) | Area ratio of cubic crystal grains (%) | Target film thickness (μm) | First layer | Second layer |
| Invention coated tool | 1 | A | A | Exist | 43 | 0.9 | 0.0001 or less | 0.12 | 40 | — | 0.3 | 2.5 | 4.065 | 100 | 3.5 | — | — |
| | 2 | B | B | Exist | 36 | 0.8 | 0.0001 or less | 0.18 | 60 | — | 0.15 | 4.0 | 4.084 | 100 | 1 | — | — |
| | 3 | C | C | Exist | 45 | 0.65 | 0.0045 | 0.24 | 95 | — | 0.2 | 6.0 | 4.114 | 95 | 2 | — | — |
| | 4 | D | D | Exist | 50 | 0.75 | 0.0001 or less | 0.10 | 20 | — | 1.0 | 2.5 | 4.094 | 100 | 4 | — | — |
| | 5 | A | E | Exist | 55 | 0.94 | 0.0001 or less | 0.08 | 55 | 51 | 0.01 or less | 1.5 | 3.0 | 4.057 | 100 | 5 | — | — |
| | 6 | B | F | Exist | 75 | 0.85 | 0.002 | 0.15 | 18 | 17 | 0.01 or less | 2.0 | 4.0 | 4.075 | 100 | 10 | — | — |
| | 7 | C | G | Exist | 45 | 0.62 | 0.0001 or less | 0.20 | 12 | 10 | 0.01 or less | 0.8 | 3.5 | 4.120 | 90 | 8 | — | — |
| | 8 | D | H | Exist | 35 | 0.88 | 0.0001 or less | 0.03 | 3 | — | — | 1.2 | 2.3 | 4.069 | 70 | 4 | — | — |
| | 9 | A | I | Exist | 65 | 0.83 | 0.0035 | 0.09 | 25 | — | — | 1.9 | 2.2 | 4.078 | 100 | 6 | Al$_2$O$_3$ (5) | — |
| | 10 | B | J | Exist | 48 | 0.7 | 0.0001 or less | 0.18 | 68 | — | — | 0.3 | 9.0 | 4.104 | 92 | 5 | TiCN (0.5) | Al$_2$O$_3$ (3) |
| | 11 | C | A | Exist | 55 | 0.9 | 0.0001 or less | 0.12 | 40 | — | — | 0.5 | 2.8 | 4.065 | 100 | 7 | TiCO (1) | Al$_2$O$_3$ (2) |
| | 12 | D | B | Exist | 45 | 0.8 | 0.0001 or less | 0.18 | 60 | — | — | 0.3 | 5.2 | 4.084 | 100 | 5 | TiCNO (0.3) | Al$_2$O$_3$ (1) |
| | 13 | A | C | Exist | 62 | 0.65 | 0.0045 | 0.24 | 95 | — | — | 0.4 | 8.0 | 4.114 | 95 | 6 | — | — |
| | 14 | B | D | Exist | 50 | 0.75 | 0.0001 or less | 0.10 | 20 | — | — | 1.0 | 2.5 | 4.094 | 100 | 3.5 | — | — |
| | 15 | C | E | Exist | 55 | 0.94 | 0.0001 or less | 0.08 | 55 | 52 | 0.01 or less | 1.5 | 2.8 | 4.057 | 100 | 4.5 | — | — |

TABLE 7

| | | | | Hard coating layer | | | | | | | | | | | | | |
|---|---|---|---|---|---|---|---|---|---|---|---|---|---|---|---|---|---|
| | | | | Ti and Al complex nitride or carbonitride layer ($Ti_{1-x}Al_xC_yN_{1-y}$) | | | | | | | | | | | | Upper layer (numerical value at the bottom indicates average target layer thickness (μm)) | |
| Type | Cutting tool body symbol | Formation symbol of TiAlCN film forming step (see Table 4) | Whether or not the highest peak of frequencies of inclination angles between normal line to {100} and normal line to cutting tool body surface exists in range of 0° to 10° | Ratio of frequencies of inclination angles of 0° to 10° between normal line to {100} and normal line to cutting tool body surface (%) | Average content ratio $X_{avg}$ of Al | Average content ratio $Y_{avg}$ of C | Δx | Period along normal line to cutting tool body surface (nm) | Period along <001> (nm) | In-plane composition change $x_O$ | Average grain width W (μm) | Average aspect ratio A | Lattice constant a (Å) | Area ratio of cubic crystal grains (%) | Target film thickness (μm) | First layer | Second layer |
| Comparative coated tool 1 | A | A' | Exist | 28 | 0.91 | 0.0001 or less | — | — | — | — | 0.5 | 1.5 | 4.063 | 88 | 3.5 | — | — |
| 2 | B | B' | Non-exist | 23 | 0.83 | 0.0001 or less | — | — | — | — | 0.3 | 2.1 | 4.078 | 92 | 1 | — | — |
| 3 | C | C' | Non-exist | 20 | 0.60 | 0.0043 | — | — | — | — | 0.6 | 3.0 | 4.124 | 75 | 2 | — | — |
| 4 | D | D' | Non-exist | 25 | 0.72 | 0.0001 or less | — | — | — | — | 1.8 | 2.0 | 4.100 | 100 | 4 | — | — |
| 5 | A | E' | Exist | 30 | 0.93 | 0.0001 or less | — | — | — | — | 3.5 | 1.2 | 4.059 | 85 | 5 | — | — |
| 6 | B | F' | Non-exist | 28 | 0.84 | 0.0025 | — | — | — | — | 1.5 | 1.4 | 4.076 | 65 | 10 | — | — |
| 7 | C | G' | Non-exist | 26 | 0.66 | 0.0001 or less | — | — | — | — | 1.2 | 2.0 | 4.112 | 75 | 8 | — | — |
| 8 | D | H' | Non-exist | 24 | 0.85 | 0.0001 or less | — | — | — | — | 1.8 | 1.1 | 4.075 | 60 | 4 | — | — |
| 9 | A | I' | Non-exist | 23 | 0.81 | 0.0031 | — | — | — | — | 3.0 | 1.2 | 4.082 | 85 | 6 | $Al_2O_3$ (5) | — |
| 10 | B | J' | Non-exist | 25 | 0.73 | 0.0001 or less | — | — | — | — | 0.6 | 3.0 | 4.098 | 88 | 5 | TiCN (0.5) | $Al_2O_3$ (3) |
| 11 | C | A' | Exist | 32 | 0.91 | 0.0001 or less | — | — | — | — | 0.5 | 1.5 | 4.063 | 85 | 7 | TiCO (1) | $Al_2O_3$ (2) |
| 12 | D | B' | Non-exist | 28 | 0.83 | 0.0001 or less | — | — | — | — | 0.3 | 2.1 | 4.078 | 90 | 5 | TiCNO (0.3) | $Al_2O_3$ (1) |
| 13 | A | C' | Non-exist | 25 | 0.60 | 0.0043 | — | — | — | — | 0.6 | 3.0 | 4.124 | 67 | 6 | — | — |
| Reference coated tool 14 | B | AIP | Non-exist | 23 | 0.50 | 0.0001 or less | — | — | — | — | 1.5 | 2.2 | 4.144 | 100 | 3.5 | — | — |
| 15 | C | AIP | Non-exist | 25 | 0.60 | 0.0001 or less | — | — | — | — | 0.6 | 2.2 | 4.123 | 100 | 4.5 | — | — |

(Note)
"AIP" indicates film formation through arc ion plating.

Next, in a state in which each of the various coated tools was clamped to a tip end portion of a cutter made of tool steel with a cutter diameter of 125 mm by a fixing jig, high speed dry face milling and a center-cut cutting test, which are a type of high-speed intermittent cutting of alloy steel and will be described below, were performed using the invention coated tools 1 to 15, the comparative coated tools 1 to 13, and the reference coated tools 14 and 15, and then the wear width of a flank face of a cutting edge was measured. The results are shown in Table 8. In addition, regarding the comparative coated tools 1 to 13 and the reference coated tools 14 and 15, the end of the tool life was reached due to the occurrence of chipping, and thus the time until the end of the tool life was reached is shown in Table 8.

Cutting tool body: tungsten carbide-based cemented carbide, titanium carbonitride-based cermet Cutting test: high speed dry face milling, center-cut cutting work Work material: a JIS SCM440 block material with a width of 100 mm and a length of 400 mm Rotational speed: 955 min$^{-1}$
Cutting speed: 375 m/min
Depth of cut: 1.2 mm
Feed per edge: 0.10 mm/edge
Cutting time: 8 minutes.

(a typical cutting speed (a cutting speed at which the efficiency in a case where a conventional coated tool is used is optimized) is 220 m/min)

TABLE 8

| Type | | Wear width of flank face (mm) | Type | | Cutting test results (min) |
|---|---|---|---|---|---|
| Invention coated tool | 1 | 0.12 | Comparative coated tool | 1 | 3.2* |
| | 2 | 0.14 | | 2 | 3.6* |
| | 3 | 0.12 | | 3 | 3.8* |
| | 4 | 0.14 | | 4 | 3.3* |
| | 5 | 0.11 | | 5 | 2.6* |
| | 6 | 0.15 | | 6 | 3.8* |
| | 7 | 0.11 | | 7 | 4.0* |
| | 8 | 0.12 | | 8 | 3.2* |
| | 9 | 0.09 | | 9 | 2.6* |
| | 10 | 0.13 | | 10 | 3.3* |
| | 11 | 0.09 | | 11 | 4.5* |
| | 12 | 0.14 | | 12 | 3.3* |
| | 13 | 0.12 | | 13 | 2.9* |
| | 14 | 0.09 | Reference coated tool | 14 | 1.3* |
| | 15 | 0.14 | | 15 | 1.9* |

Mark * in boxes of comparative coated tools and reference coated tools indicates a cutting time (min) until the end of a tool life caused by the occurrence of chipping.

Example 2

As raw material powders, a WC powder, a TiC powder, a ZrC powder, a TaC powder, an NbC powder, a $Cr_3C_2$ powder, a TiN powder, and a Co powder, all of which had an average particle diameter of 1 μm to 3 μm, were prepared, and the raw material powders were mixed in mixing compositions shown in Table 9. Wax was further added thereto, and the resultant was blended in acetone by a ball mill for 24 hours and was decompressed and dried. Thereafter, the resultant was press-formed into a compact having a predetermined shape at a pressure of 98 MPa, and the compact was sintered in a vacuum at 5 Pa under the condition where the compact was held at a predetermined temperature in a range of 1370° C. to 1470° C. for one hour. After the sintering, each of cutting tool bodies α to γ made of WC-based cemented carbide with an insert shape according to ISO standard CNMG120412 was produced by performing honing with R: 0.07 mm on a cutting edge portion.

In addition, as raw material powders, a TiCN (TiC/TiN=50/50 in terms of mass ratio) powder, an NbC powder, a WC powder, a Co powder, and an Ni powder, all of which had an average particle diameter of 0.5 μm to 2 μm, were prepared, and the raw material powders were mixed in mixing compositions shown in Table 10. The mixture was subjected to wet mixing by a ball mill for 24 hours, and was dried. Thereafter, the resultant was press-formed into a compact at a pressure of 98 MPa, and the compact was sintered in a nitrogen atmosphere at 1.3 kPa under the condition where the compact was held at a temperature of 1500° C. for one hour. After the sintering, a cutting tool body δ made of TiCN-based cermet with an insert shape according to ISO standard CNMG120412 was produced by performing honing with R: 0.09 mm on a cutting edge portion.

Subsequently, invention coated tools 16 to 30 shown in Table 17 were produced by depositing a hard coating layer including at least a $(Ti_{1-x}Al_x)(C_yN_{1-y})$ layer on the surfaces of the cutting tool bodies α to γ and the cutting tool body δ to have target layer thicknesses using a typical chemical vapor deposition apparatus under the conditions shown in Tables 3 and 4 in the same method as that in Example 1.

In addition, in addition to the $(Ti_{1-x}Al_x)(C_yN_{1-y})$ layer, a lower layer shown in Table 11 and/or an upper layer shown in Table 12 was formed in the invention coated tools 19 to 28 under the forming conditions shown in Table 3.

In addition, for the purpose of comparison, comparative coated tools 16 to 28 shown in Table 13 were produced by depositing a hard coating layer on the surfaces of the same cutting tool bodies α to γ and the cutting tool body δ to have target layer thicknesses (μm) shown in Table 13 using a typical chemical vapor deposition apparatus under the conditions shown in Tables 3 and 4, like the comparative coated tools 1 to 13 of Example 1.

In addition, like the invention coated tools 19 to 28, a lower layer shown in Table 11 and/or an upper layer shown in Table 13 was formed in the comparative coated tools 19 to 28 under the forming conditions shown in Table 3.

For reference, reference coated tools 29 and 30 shown in Table 13 were produced by depositing a $(Ti_{1-x}Al_x)(C_yN_{1-y})$ layer of the reference example on the surfaces of the cutting tool body β and the cutting tool body γ to have target layer thicknesses through arc ion plating using a conventional physical vapor deposition apparatus.

The same conditions as those described in Example 1 were used as the conditions of the arc ion plating.

The section of each of constituent layers of the invention coated tools 16 to 30, the comparative coated tools 16 to 28, and the reference coated tools 29 and 30 was observed using an electron scanning microscope (at a magnification of 5,000-fold). As in Example 1, an average layer thickness was obtained by measuring and averaging the layer thicknesses of five points in an observation visual field. All of the results showed substantially the same average layer thicknesses as the target layer thicknesses shown in Tables 12 and 13.

Regarding the hard coating layers of the invention coated tools 16 to 30, the comparative coated tools 16 to 28, and the reference coated tools 29 and 30, using the same method as that described in Example 1, the average content ratio $X_{avg}$ of Al, the average content ratio $Y_{avg}$ of C, the average grain width W and the average aspect ratio A of crystal grains with a cubic structure included in the $(Ti_{1-x}Al_x)(C_yN_{1-y})$ layer in a columnar structure were calculated. Furthermore, whether or not the highest peak of inclination angle frequencies existed in a range of 0° to 10° in an inclination angle frequency distribution obtained in the same method as in Example 1 was checked, and the ratio of frequencies at which inclination angles existed in the range of 0° to 10° was obtained. In addition, the area ratio and the lattice constant of the cubic crystal grains were measured in the same method as in Example 1.

The Ti and Al complex nitride or carbonitride layer included in the hard coating layers of the invention coated tools 16 to 30 was observed over a plurality of visual fields using an electron scanning microscope (at a magnification of 5,000-fold and 20,000-fold). As shown in the film configuration schematic view shown in FIG. 3, crystal grains with a cubic structure in which a periodic composition change of Ti and Al existed in the $(Ti_{1-x}Al_x)(C_yN_{1-y})$ layer were confirmed. In addition, a periodic composition change of Ti and Al in the cubic crystal grains was confirmed through plane analysis by energy-dispersive X-ray spectroscopy (EDS) using the transmission electron microscope (at a magnification of 200,000-fold) as in Example 1. As a result of more detailed analysis as in Example 1, it was confirmed that the difference Δx obtained by subtracting the average of local minimum values from the average of local maximum values of x was 0.03 to 0.25. In addition, a period of the composition change of Ti and Al along the direction of the normal line to the cutting tool body surface, a period along <001>, and an in-plane composition change $X_O$ were measured in the same method as in Example 1.

TABLE 9

| Type | | Mixing composition (mass %) | | | | | | |
|---|---|---|---|---|---|---|---|---|
| | | Co | TiC | ZrC | TaC | NbC | $Cr_3C_2$ | TiN | WC |
| Cutting tool body | α | 6.5 | — | 1.5 | — | 2.9 | 0.1 | 1.5 | Balance |
| | β | 7.6 | 2.6 | — | 4.0 | 0.5 | — | 1.1 | Balance |
| | γ | 6.0 | — | — | — | — | — | — | Balance |

TABLE 10

| Type | | Mixing composition (mass %) | | | | |
|---|---|---|---|---|---|---|
| | | Co | Ni | NbC | WC | TiCN |
| Cutting tool body | δ | 11 | 4 | 6 | 15 | Balance |

TABLE 11

| Cutting tool | body symbol | Hard coating layer (numerical value at the bottom indicates target average layer thickness (μm)) Lower layer | | | |
|---|---|---|---|---|---|
| Type | | First layer | Second layer | Third layer | Fourth layer |
| Invention coated tool, Comparative coated tool, Reference coated tool | 16 α | — | — | — | — |
| | 17 β | — | — | — | — |
| | 18 γ | — | — | — | — |
| | 19 δ | TiC (0.5) | — | — | — |
| | 20 α | TiN-① (0.1) | — | — | — |
| | 21 β | TiN-① (0.5) | 1-TiCN-① (7) | — | — |
| | 22 γ | TiN-① (0.3) | 1-TiCN-① (10) | TiN-② (0.7) | — |
| | 23 δ | TiN-① (0.3) | 1-TiCN-① (4) | TiCN (0.4) | TiN-② (0.3) |
| | 24 α | — | — | — | — |
| | 25 β | TiN-① (0.5) | — | — | — |
| | 26 γ | TiC (1) | — | — | — |
| | 27 δ | TiN-① (0.1) | — | — | — |
| | 28 α | TiN-① (0.1) | — | — | — |
| | 29 β | — | — | — | — |
| | 30 γ | — | — | — | — |

TABLE 12

| Type | Cutting tool body symbol | Formation symbol of TiAlCN film forming step (see Table 4) | Hard coating layer - Ti and Al complex nitride or carbonitride layer (Ti₁₋ₓAlₓ)(CᵧN₁₋ᵧ) ||||||||||||| Upper layer (numerical value at the bottom indicates average target layer thickness (μm)) ||||
|---|---|---|---|---|---|---|---|---|---|---|---|---|---|---|---|---|---|---|
| | | | Whether or not the highest peak of frequencies of inclination angles between normal line to {100} and normal line to cutting tool body surface exists in range of 0° to 10° | Ratio of frequencies of inclination angles of 0° to 10° between normal line to {100} and normal line to cutting tool body surface (%) | Average content ratio $X_{avg}$ of Al | Average content ratio $Y_{avg}$ of C | Δx | Period along normal line to cutting tool body surface (nm) | Period along <001> (nm) | In-plane composition change $X_O$ | Average grain width W (μm) | Average aspect ratio A | Lattice constant a (Å) | Area ratio of cubic crystal grains (%) | Target film thickness (μm) | First layer | Second layer | Third layer | Fourth layer |
| Invention coated tool | 16 | α | A | Exist | 52 | 0.90 | 0.0001 or less | 0.12 | 40 | — | — | 0.3 | 2.8 | 4.065 | 100 | 6 | — | — | — | — |
| | 17 | β | B | Exist | 37 | 0.80 | 0.0001 or less | 0.18 | 60 | — | — | 0.15 | 4.0 | 4.084 | 100 | 2 | — | — | — | — |
| | 18 | γ | C | Exist | 48 | 0.65 | 0.0045 | 0.24 | 95 | — | — | 0.25 | 5.8 | 4.114 | 95 | 7 | — | — | — | — |
| | 19 | δ | D | Exist | 63 | 0.75 | 0.0001 or less | 0.10 | 20 | — | — | 1.0 | 2.5 | 4.094 | 100 | 12 | — | — | — | — |
| | 20 | α | E | Exist | 74 | 0.94 | 0.0001 or less | 0.08 | 55 | 54 | 0.01 or less | 1.8 | 3.1 | 4.057 | 100 | 16 | — | — | — | — |
| | 21 | β | F | Exist | 73 | 0.85 | 0.002 | 0.15 | 18 | 17 | 0.01 or less | 2.1 | 5.0 | 4.075 | 100 | 11 | — | — | — | — |
| | 22 | γ | G | Exist | 55 | 0.62 | 0.0001 or less | 0.20 | 12 | 10 | 0.01 or less | 0.9 | 3.8 | 4.120 | 90 | 20 | — | — | — | — |
| | 23 | δ | H | Exist | 43 | 0.88 | 0.0001 or less | 0.03 | 3 | — | — | 1.6 | 2.8 | 4.069 | 70 | 15 | TiCN (0.4) | TiN-② (0.3) | — | — |
| | 24 | α | I | Exist | 63 | 0.83 | 0.004 | 0.09 | 25 | — | — | 1.9 | 2.2 | 4.078 | 100 | 5 | Al₂O₃ (4) | — | — | — |
| | 25 | β | J | Exist | 45 | 0.70 | 0.0001 or less | 0.18 | 68 | — | — | 0.3 | 9.0 | 4.104 | 92 | 7 | TiCN (0.5) | Al₂O₃ (5) | — | — |
| | 26 | γ | A | Exist | 52 | 0.90 | 0.0001 or less | 0.12 | 40 | — | — | 0.5 | 2.8 | 4.065 | 100 | 4 | TiCO (1) | Al₂O₃ (2) | — | — |
| | 27 | δ | B | Exist | 48 | 0.80 | 0.0001 or less | 0.18 | 60 | — | — | 0.3 | 5.2 | 4.084 | 100 | 11 | TiCNO (0.3) | Al₂O₃ (1) | — | — |
| | 28 | α | C | Exist | 57 | 0.65 | 0.004 | 0.24 | 95 | — | — | 0.4 | 8.0 | 4.114 | 95 | 5 | TiN-② (0.3) | TiCN (0.8) | — | — |
| | 29 | β | D | Exist | 60 | 0.75 | 0.0001 or less | 0.10 | 20 | — | — | 1.4 | 2.6 | 4.094 | 100 | 6 | — | — | — | — |
| | 30 | γ | E | Exist | 53 | 0.94 | 0.0001 or less | 0.08 | 55 | 50 | 0.01 or less | 1.5 | 3.0 | 4.057 | 100 | 5 | TiN-② (0.3) | TiCN (0.8) | TiCNO (0.3) | Al₂O₃ (5) |

TABLE 13

| Type | | Cutting tool body symbol | Formation symbol of TiAlCN film forming step (see Table 4) | Hard coating layer | | | | | | | | | | | | Upper layer (numerical value at the bottom indicates average target layer thickness (μm)) | | | |
|---|---|---|---|---|---|---|---|---|---|---|---|---|---|---|---|---|---|---|---|
| | | | | Ti and Al complex nitride or carbonitride layer ($Ti_{1-x}Al_xC_yN_{1-y}$) | | | | | | | | | | | | Target film thickness (μm) | First layer | Second layer | Third layer | Fourth layer |
| | | | | Whether or not the highest peak of frequencies of inclination angles between normal line to {100} and normal line to cutting tool body surface exists in range of 0° to 10° | Ratio of frequencies of inclination angles of 0° to 10° between normal line to {100} and normal line to cutting tool body surface (%) | Average content ratio $X_{avg}$ of Al | Average content ratio $Y_{avg}$ of C | Δx | Period along normal line to cutting tool body surface (nm) | Period along <001> (nm) | In-plane composition change $X_O$ | Average grain width W (μm) | Average aspect ratio A | Lattice constant a (Å) | Area ratio of cubic crystal grains (%) | | | | |
| Comparative coated tool | 16 | α | A' | Exist | 28 | 0.91 | 0.0001 or less | — | — | — | — | 0.5 | 1.5 | 4.063 | 87 | 6 | — | — | — | — |
| | 17 | β | B' | Non-exist | 23 | 0.83 | 0.0001 or less | — | — | — | — | 0.3 | 2.1 | 4.078 | 92 | 2 | — | — | — | — |
| | 18 | γ | C' | Non-exist | 20 | 0.60 | 0.0043 | — | — | — | — | 0.6 | 3.0 | 4.124 | 75 | 7 | — | — | — | — |
| | 19 | δ | D' | Non-exist | 25 | 0.72 | 0.0001 or less | — | — | — | — | 1.8 | 2.0 | 4.100 | 100 | 12 | — | — | — | — |
| | 20 | α | E' | Exist | 30 | 0.93 | 0.0001 or less | — | — | — | — | 3.5 | 1.2 | 4.059 | 85 | 16 | — | — | — | — |
| | 21 | β | F' | Exist | 28 | 0.84 | 0.0025 | — | — | — | — | 1.5 | 1.4 | 4.076 | 65 | 11 | TiN-② (0.7) | — | — | — |
| | 22 | γ | G' | Non-exist | 26 | 0.66 | 0.0001 or less | — | — | — | — | 1.2 | 2.0 | 4.112 | 75 | 20 | TiCN (0.4) | TiN-② (0.3) | — | — |
| | 23 | δ | H' | Non-exist | 24 | 0.85 | 0.0001 or less | — | — | — | — | 1.8 | 1.1 | 4.075 | 60 | 15 | $Al_2O_3$ (4) | — | — | — |
| | 24 | α | I' | Non-exist | 23 | 0.81 | 0.0031 | — | — | — | — | 3.0 | 1.2 | 4.082 | 85 | 5 | TiCN (0.5) | $Al_2O_3$ (5) | — | — |
| | 25 | β | J' | Non-exist | 25 | 0.73 | 0.0001 or less | — | — | — | — | 0.6 | 3.0 | 4.098 | 88 | 7 | TiCO (1) | $Al_2O_3$ (2) | — | — |
| | 26 | γ | A' | Exist | 32 | 0.91 | 0.0001 or less | — | — | — | — | 0.5 | 1.5 | 4.063 | 86 | 4 | TiCNO (0.3) | $Al_2O_3$ (1) | — | — |
| | 27 | δ | B' | Exist | 28 | 0.83 | 0.0001 or less | — | — | — | — | 0.3 | 2.1 | 4.078 | 90 | 11 | TiN-② (0.3) | TiCN (0.8) | — | — |
| | 28 | α | C' | Non-exist | 25 | 0.60 | 0.0043 | — | — | — | — | 0.6 | 3.0 | 4.124 | 67 | 5 | — | — | — | — |
| Reference coated tool | 29 | β | AIP | Non-exist | 23 | 0.50 | 0.0001 or less | — | — | — | — | 1.5 | 3.3 | 4.144 | 100 | 6 | — | — | — | — |
| | 30 | γ | AIP | Non-exist | 25 | 0.60 | 0.0001 or less | — | — | — | — | 0.6 | 2.2 | 4.123 | 100 | 5 | — | TiCN (0.3) | TiCNO (0.3) | $Al_2O_3$ (5) |

(Note)
"AIP" indicates film formation through arc ion plating.

Next, in a state in which each of the various coated tools was screw-clamped to a tip end portion of an insert holder made of tool steel by a fixing jig, a high speed dry intermittent cutting test (under cutting conditions 1) for carbon steel and a high speed wet intermittent cutting test (under cutting conditions 2) for cast iron, which will be described below, were performed using the invention coated tools 16 to 30, the comparative coated tools 16 to 28, and the reference coated tools 29 and 30, and then the wear width of a flank face of a cutting edge was measured in either case. The results are shown in Table 14. In addition, regarding the comparative coated tools 16 to 28 and the reference coated tools 29 and 30, the end of the tool life was reached due to the occurrence of chipping, and thus the time until the end of the tool life was reached is shown in Table 14.

Cutting Conditions 1:
Work material: a round bar with four longitudinal grooves formed at equal intervals in the longitudinal direction according to JIS SCM435
Cutting speed: 380 m/min
Depth of cut: 1.2 mm
Feed: 0.1 mm/rev
Cutting time: 5 minutes.
(a typical cutting speed is 220 m/min)

Cutting Conditions 2:
Work material: a round bar with four longitudinal grooves formed at equal intervals in the longitudinal direction according to JIS FCD700
Cutting speed: 310 m/min
Depth of cut: 1.2 mm
Feed: 0.1 mm/rev
Cutting time: 5 minutes.
(a typical cutting speed is 180 m/min)

in a vacuum atmosphere at a pressure of 1 Pa under the condition where the compact was held at a predetermined temperature in a range of 900° C. to 1300° C. for 60 minutes, thereby producing a cutting edge preliminary sintered material. In a state in which the preliminary sintered material was superimposed on a support piece made of WC-based cemented carbide, which was separately prepared and had a composition of Co: 8 mass % and WC: the balance, a diameter of 50 mm, and a thickness of 2 mm, the resultant was loaded in a typical ultra-high pressure sintering apparatus, and was subjected to ultra-high pressure sintering under typical conditions including a pressure of 4 GPa, a predetermined temperature in a range of 1200° C. to 1400° C., and a holding time of 0.8 hours. After the sintering, upper and lower surfaces of the sintered material were polished using a diamond grinding stone, and were split into predetermined size by a wire electric discharge machine. Furthermore, the split sintered material was brazed to a brazing portion (corner portion) of an insert body made of WC-based cemented carbide having a composition including Co: 5 mass %, TaC: 5 mass %, and WC: the balance and a shape (a 80° rhombic shape with a thickness of 4.76 mm and an inscribed circle diameter of 12.7 mm) according to JIS standard CNGA120412 using a Ti—Zr—Cu alloy-based brazing filler material having a composition including Zr: 37.5%, Cu: 25%, and Ti: the balance in terms of mass %, and the outer circumference thereof was machined into predetermined dimensions. Thereafter, a cutting edge portion was subjected to honing with a width of 0.13 mm and an angle of 25°, and the resultant was further subjected to finish polishing, thereby producing each of cutting tool bodies E and F with an insert shape according to ISO standard CNGA120412.

TABLE 14

| Type | | Wear width of flank face (mm) Cutting conditions 1 | Cutting conditions 2 | Type | | Cutting test result (min) Cutting conditions 1 | Cutting conditions 2 |
|---|---|---|---|---|---|---|---|
| Invention coated tool | 16 | 0.19 | 0.22 | Comparative coated tool | 16 | 3.6* | 2.8* |
| | 17 | 0.22 | 0.24 | | 17 | 3.4* | 2.5* |
| | 18 | 0.21 | 0.22 | | 18 | 3.6* | 4.4* |
| | 19 | 0.23 | 0.25 | | 19 | 2.2* | 2.4* |
| | 20 | 0.19 | 0.22 | | 20 | 4.3* | 3.6* |
| | 21 | 0.19 | 0.22 | | 21 | 4.2* | 3.4* |
| | 22 | 0.20 | 0.20 | | 22 | 4.1* | 4.5* |
| | 23 | 0.21 | 0.25 | | 23 | 3.1* | 3.1* |
| | 24 | 0.23 | 0.23 | | 24 | 4.7* | 3.8* |
| | 25 | 0.17 | 0.19 | | 25 | 4.8* | 3.9* |
| | 26 | 0.15 | 0.15 | | 26 | 4.3* | 4.5* |
| | 27 | 0.22 | 0.26 | | 27 | 2.9* | 2.3* |
| | 28 | 0.21 | 0.23 | | 28 | 4.8* | 4.2* |
| | 29 | 0.22 | 0.24 | Reference coated tool | 29 | 2.1* | 1.9* |
| | 30 | 0.15 | 0.17 | | 30 | 2.0* | 1.8* |

Mark * in boxes of comparative coated tools and reference coated tools indicates a cutting time (min) until the end of a tool life caused by the occurrence of chipping.

Example 3

As raw material powders, a cBN powder, a TiN powder, a TiC powder, an Al powder, and an $Al_2O_3$ powder, all of which had an average particle diameter of 0.5 μm to 4 μm, were prepared, and the raw material powders were mixed in mixing compositions shown in Table 15. The mixture was wet-blended by a ball mill for 80 hours and was dried. Thereafter, the resultant was press-formed into a compact having a diameter of 50 mm and a thickness of 1.5 mm at a pressure of 120 MPa, and then the compact was sintered

TABLE 15

| Type | | Mixing composition (mass %) TiN | TiC | Al | $Al_2O_3$ | cBN |
|---|---|---|---|---|---|---|
| Cutting tool body | E | 50 | — | 5 | 3 | Balance |
| | F | — | 50 | 4 | 3 | Balance |

Subsequently, invention coated tools 31 to 40 shown in Table 17 were produced by depositing a hard coating layer including at least a $(Ti_{1-x}Al_x)(C_yN_{1-y})$ layer on the surfaces of the cutting tool bodies F and F using a typical chemical vapor deposition apparatus to have target layer thicknesses under the conditions shown in Tables 3 and 4 in the same method as that in Example 1.

In addition, in the invention coated tools 34 to 38, in addition to the $(Ti_{1-x}Al_x)(C_yN_{1-y})$ layer, a lower layer shown in Table 16 and/or an upper layer shown in Table 17 was formed under the forming conditions shown in Table 3.

In addition, for the purpose of comparison, comparative coated tools 31 to 38 shown in Table 18 were produced by depositing a hard coating layer including at least a $(Ti_{1-x}Al_x)(C_yN_{1-y})$ layer on the surfaces of the same cutting tool bodies E and F to have target layer thicknesses under the conditions shown in Tables 3 and 4 using a typical chemical vapor deposition apparatus.

In addition, like the invention coated tools 34 to 38, in the comparative coated tools 34 to 38, a lower layer shown in Table 16 and/or an upper layer shown in Table 18 was formed under the forming conditions shown in Table 3.

For reference, reference coated tools 39 and 40 shown in Table 18 were produced by depositing a $(Ti_{1-x}Al_x)(C_yN_{1-y})$ layer on the surfaces of the cutting tool bodies E and F to have target layer thicknesses through arc ion plating using a conventional physical vapor deposition apparatus.

As the conditions of the arc ion plating, the same conditions as those described in Example 1 were used, and the reference coated tools 39 and 40 were produced by depositing an (Al,Ti)N layer on the surfaces of the cutting tool bodies to have target compositions and target layer thicknesses shown in Table 18.

The section of each of constituent layers of the invention coated tools 31 to 40, the comparative coated tools 31 to 38, and the reference coated tools 39 and 40 was observed using an electron scanning microscope (at a magnification of 5,000-fold). As in Example 1, an average layer thickness was obtained by measuring and averaging the layer thicknesses of five points in an observation visual field. All of the results showed substantially the same average layer thicknesses as the target layer thicknesses shown in Tables 17 and 18.

Regarding the hard coating layers of the invention coated tools 31 to 40, the comparative coated tools 31 to 38, and the reference coated tools 39 and 40, using the same method as that described in Example 1, the average content ratio $X_{avg}$ of Al, the average content ratio $Y_{avg}$ of C, the average grain width W and the average aspect ratio A of crystal grains with a cubic structure included in the $(Ti_{1-x}Al_x)(C_yN_{1-y})$ layer were calculated. Furthermore, whether or not the highest peak of inclination angle frequencies existed in a range of 0° to 10° in an inclination angle frequency distribution obtained in the same method as in Example 1 was checked, and the ratio of frequencies at which inclination angles existed in the range of 0° to 10° was obtained. In addition, the area ratio and the lattice constant of the cubic crystal grains, a period of the composition change of Ti and Al along the direction of the normal line to the cutting tool body surface, a period along <001>, the difference Δx obtained by subtracting the average of local minimum values from the average of local maximum values of x, and an in-plane composition change $X_O$ were measured in the same method as in Example 1.

TABLE 16

| Type | Cutting tool body symbol | Hard coating layer (numerical value at the bottom indicates target average layer thickness (μm)) | | |
|---|---|---|---|---|
| | | Lower layer | | |
| | | First layer | Second layer | Third layer |
| Invention coated tool, Comparative coated tool, Reference coated tool | 31 | — | — | — |
| | 32 | — | — | — |
| | 33 | — | — | — |
| | 34 | TiC (0.5) | — | — |
| | 35 | TiN-③ (0.5) | — | — |
| | 36 | TIN-③ (0.1) | — | — |
| | 37 | TiN-③ (0.5) | 1-TiCN-② (3) | — |
| | 38 | TIN-③ (0.3) | 1-TiCN-② (7) | TiN-③ (0.7) |
| | 39 | — | — | — |
| | 40 | — | — | — |

TABLE 17

| Type | Cutting tool body symbol | Formation symbol of TiAlCN film forming step (see Table 4) | Whether or not the highest peak of frequencies of inclination angles between normal line to {100} and normal line to cutting tool body surface exists in range of 0° to 10° | Ratio of frequencies of inclination angles of 0° to 10° between normal line to {100} and normal line to cutting tool body surface (%) | Average content ratio $X_{avg}$ of Al | Average content ratio $Y_{avg}$ of C | Δx | Period along normal line to cutting tool body surface (nm) |
|---|---|---|---|---|---|---|---|---|
| Invention coated tool | 31 | E | A | Exist | 45 | 0.9 | 0.0001 or less | 0.12 | 40 |
| | 32 | F | B | Exist | 37 | 0.8 | 0.0001 or less | 0.18 | 60 |
| | 33 | E | C | Exist | 43 | 0.65 | 0.0045 | 0.24 | 95 |
| | 34 | F | D | Exist | 36 | 0.75 | 0.0001 or less | 0.10 | 20 |
| | 35 | E | E | Exist | 50 | 0.94 | 0.0001 or less | 0.08 | 55 |
| | 36 | F | F | Exist | 48 | 0.85 | 0.002 or less | 0.15 | 18 |
| | 37 | E | G | Exist | 43 | 0.62 | 0.0001 or less | 0.20 | 12 |

TABLE 17-continued

| | | | | | | | | |
|---|---|---|---|---|---|---|---|---|
| 38 | F | H | Exist | 36 | 0.88 | 0.0001 or less | 0.03 | 3 |
| 39 | E | I | Exist | 63 | 0.83 | 0.0035 | 0.09 | 25 |
| 40 | F | J | Exist | 44 | 0.7 | 0.0001 or less | 0.18 | 68 |

Hard coating layer

Ti and Al complex nitride or carbonitride layer $(Ti_{1-x}Al_x)(C_yN_{1-y})$

| Type | | Period along <001> (nm) | In-plane composition change $X_O$ | Average grain width W (μm) | Average aspect ratio A | Lattice constant a (Å) | Area ratio of cubic crystal grains (%) | Target film thickness (μm) | Upper layer (numerical value at the bottom indicates average target layer thickness (μm)) |
|---|---|---|---|---|---|---|---|---|---|
| Invention coated tool | 31 | — | — | 0.3 | 2.5 | 4.065 | 100 | 6 | — |
| | 32 | — | — | 0.12 | 3.5 | 4.084 | 100 | 2 | — |
| | 33 | — | — | 0.2 | 6.0 | 4.114 | 93 | 5 | — |
| | 34 | — | — | 0.5 | 1.5 | 4.094 | 100 | 1 | — |
| | 35 | 52 | 0.01 or less | 1.5 | 3.0 | 4.057 | 100 | 5 | TiN-③ (0.5) |
| | 36 | 16 | 0.01 or less | 1.2 | 1.6 | 4.075 | 100 | 3 | — |
| | 37 | 10 | 0.01 or less | 0.8 | 3.5 | 4.120 | 91 | 6 | — |
| | 38 | — | — | 1 | 2.1 | 4.069 | 75 | 4 | — |
| | 39 | — | — | 1.8 | 2.5 | 4.078 | 100 | 8 | — |
| | 40 | — | — | 0.2 | 7.0 | 4.104 | 92 | 3 | — |

TABLE 18

Hard coating layer
Ti and Al complex nitride or carbonitride layer $(Ti_{1-x}Al_x)(C_yN_{1-y})$

| Type | | Cutting tool body symbol | Formation symbol of TiAlCN film forming step (see Table 4) | Whether or not the highest peak of frequencies of inclination angles between normal line to {100} and normal line to cutting tool body surface exists in range of 0° to 10° | Ratio of frequencies of inclination angles of 0° to 10° between normal line to {100} and normal line to cutting tool body surface (%) | Average content ratio $X_{avg}$ of Al | Average content ratio $Y_{avg}$ of C | Δx | Period along normal line to cutting tool body surface (nm) |
|---|---|---|---|---|---|---|---|---|---|
| Comparative coated tool | 31 | E | A' | Non-exist | 26 | 0.91 | 0.0001 or less | — | — |
| | 32 | F | B' | Non-exist | 25 | 0.83 | 0.0001 or less | — | — |
| | 33 | E | C' | Non-exist | 22 | 0.6 | 0.0043 | — | — |
| | 34 | F | D' | Non-exist | 24 | 0.72 | 0.0001 or less | — | — |
| | 35 | E | E' | Non-exist | 24 | 0.93 | 0.0001 or less | — | — |
| | 36 | F | F' | Non-exist | 25 | 0.84 | 0.0025 | — | — |
| | 37 | E | G' | Exist | 29 | 0.66 | 0.0001 or less | — | — |
| | 38 | F | H' | Non-exist | 25 | 0.85 | 0.0001 or less | — | — |
| Reference coated tool | 39 | E | AIP | Non-exist | 23 | 0.50 | 0.0001 or less | — | — |
| | 40 | F | AIP | Non-exist | 25 | 0.60 | 0.0001 or less | — | — |

TABLE 18-continued

Hard coating layer

Ti and Al complex nitride or carbonitride layer $(Ti_{1-x}Al_x)(C_yN_{1-y})$

| Type | | Period along <001> (nm) | In-plane composition change $X_O$ | Average grain width W (μm) | Average aspect ratio A | Lattice constant a (Å) | Area ratio of cubic crystal grains (%) | Target film thickness (μm) | Upper layer (numerical value at the bottom indicates average target layer thickness (μm)) |
|---|---|---|---|---|---|---|---|---|---|
| Comparative coated tool | 31 | — | — | 0.5 | 1.5 | 4.063 | 90 | 6 | — |
| | 32 | — | — | 0.3 | 2.0 | 4.078 | 91 | 2 | — |
| | 33 | — | — | 0.6 | 3.0 | 4.124 | 72 | 5 | — |
| | 34 | — | — | 0.6 | 1.2 | 4.100 | 100 | 1 | — |
| | 35 | — | — | 3.5 | 1.2 | 4.059 | 86 | 5 | TiN-③ (0.5) |
| | 36 | — | — | 1.4 | 1.5 | 4.076 | 67 | 3 | — |
| | 37 | — | — | 1.2 | 2.0 | 4.112 | 72 | 6 | — |
| | 38 | — | — | 1.8 | 1.1 | 4.075 | 55 | 4 | — |
| Reference coated tool | 39 | — | — | 1.5 | 3.3 | 4.144 | 100 | 8 | — |
| | 40 | — | — | 0.6 | 2.2 | 4.123 | 100 | 3 | — |

(Note)
"AIP" indicates film formation through arc ion plating.

Next, in a state in which each of the various coated tools was screw-clamped to a tip end portion of an insert holder made of tool steel by a fixing jig, a high speed dry intermittent cutting work test for carbolized steel, which will be described below, was performed using the invention coated tools 31 to 40, the comparative coated tools 31 to 38, and the reference coated tools 39 and 40, and then the wear width of a flank face of a cutting edge was measured. The results are shown in Table 19. In addition, regarding the comparative coated tools 31 to 38 and the reference coated tools 39 and 40, the end of the tool life was reached due to the occurrence of chipping, and thus the time until the end of the tool life was reached is shown in Table 19.

Cutting tool body: cubic boron nitride-based ultra-high pressure sintered material Cutting test: high speed dry intermittent cutting work for carbolized steel Work material: a round bar with four longitudinal grooves formed at equal intervals in the longitudinal direction according to JIS SCr420 (hardness: HRC60)

Cutting speed: 235 m/min
Depth of cut: 0.10 mm
Feed: 0.12 mm/rev
Cutting time: 4 minutes

TABLE 19

| Type | | Wear width of flank face (mm) | Type | | Cutting test result (min) |
|---|---|---|---|---|---|
| Invention coated tool | 31 | 0.12 | Comparative coated tool | 31 | 1.9* |
| | 32 | 0.09 | | 32 | 2.6* |
| | 33 | 0.13 | | 33 | 2.3* |
| | 34 | 0.14 | | 34 | 2.4* |
| | 35 | 0.09 | | 35 | 2.1* |
| | 36 | 0.12 | | 36 | 2.0* |
| | 37 | 0.10 | | 37 | 2.3* |
| | 38 | 0.08 | | 38 | 1.8* |

TABLE 19-continued

| Type | | Wear width of flank face (mm) | Type | | Cutting test result (min) |
|---|---|---|---|---|---|
| | 39 | 0.12 | Reference coated tool | 39 | 1.6* |
| | 40 | 0.09 | | 40 | 1.5* |

Mark * in boxes of comparative coated tools and reference coated tools indicates a cutting time (min) until the end of a tool life caused by the occurrence of chipping.

From the results shown in Tables 8, 14, and 19, in the invention coated tools 1 to 40, a periodic composition change of Ti and Al existed in the cubic crystal grains in the Al and Ti complex nitride or carbonitride layer included in the hard coating layer. Therefore, hardness was improved due to strain introduced into crystal grains. Therefore, toughness was improved while high wear resistance was maintained. Furthermore, it was apparent that the invention coated tools 1 to 40 exhibited excellent chipping resistance and excellent defect resistance and as a result, exhibited excellent wear resistance for long-term usage even in a case of being used for high-speed intermittent cutting work during which intermittent and impact loads were exerted on a cutting edge.

Contrary to this, it was apparent that the comparative coated tools 1 to 13, 16 to 28, 31 to 38, and the reference coated tools 14, 15, 29, 30, 39, and 40, in which a composition change of Ti and Al did not exist in the cubic crystal grains in the Al and Ti complex nitride or carbonitride layer included in the hard coating layer, generated high-temperature heat and generated chipping, defect, and the like in a case of being used for high-speed intermittent cutting work during which intermittent and impact loads were exerted on a cutting edge, and the end of the tool life thereof was reached within a short time.

INDUSTRIAL APPLICABILITY

As described above, the coated tools of the present invention can be used as coated tools for various work materials as well as for high-speed intermittent cutting work of alloy steel and further exhibits excellent chipping resistance and wear resistance for long-term usage. Therefore, the coated tools of the present invention can satisfactorily cope with the need for an improvement in performance of a cutting device, power saving and energy saving during cutting work, and a further reduction in costs.

REFERENCE SIGNS LIST

1 CUTTING TOOL BODY
2 HARD COATING LAYER
3 COMPLEX NITRIDE OR CARBONITRIDE LAYER (($Ti_{1-x}Al_x$)($C_yN_{1-y}$) LAYER)
4 LOWER LAYER
5 UPPER LAYER
13 CUBIC CRYSTAL GRAIN
13a REGION WITH RELATIVELY HIGH CONTENT OF Al
13b REGION WITH RELATIVELY LOW CONTENT OF Al

The invention claimed is:
1. A surface-coated cutting tool comprising:
a cutting tool body made of any one of tungsten carbide-based cemented carbide, titanium carbonitride-based cermet, and cubic boron nitride-based ultra-high pressure sintered material; and
a hard coating layer provided on a surface of the cutting tool body, wherein
(a) the hard coating layer comprises at least a Ti and Al complex nitride or carbonitride layer, which is formed by a chemical vapor deposition method and has an average layer thickness of 1 to 20 μm,
in a case where a composition of the complex nitride or carbonitride layer is expressed by a composition formula: ($Ti_{1-x}Al_x$)($C_yN_{1-y}$), an average content ratio $X_{avg}$, which is a ratio of Al to a total amount of Ti and Al in the complex nitride or carbonitride layer; and an average content ratio $Y_{avg}$, which is a ratio of C to a total amount of C and N in the complex nitride or carbonitride layer, satisfy $0.60 \leq X_{avg} \leq 0.95$ and $0 \leq Y_{avg} \leq 0.005$, provided that each of $X_{avg}$ and $Y_{avg}$ is in atomic ratio,
(b) the complex nitride or carbonitride layer includes at least a phase constituted by complex nitride or complex carbonitride with a NaCl type face-centered cubic structure,
(c) regarding the complex nitride or carbonitride layer, in a case where a crystal orientation of each of crystal grains with the NaCl type face-centered cubic structure in the complex nitride or carbonitride layer is analyzed from a vertical section direction of the complex nitride or carbonitride layer using an electron backscatter diffraction apparatus: in an inclination angle frequency distribution, a highest peak exists in an inclination angle division in a range of 0° to 10° and the sum of frequencies in the range of 0° to 10° is 35% or more to the total frequencies in the inclination angle frequency distribution, the inclination angle frequency distribution being obtained by counting a frequency of occurrence of an inclination angle between a normal line to {100} crystal planes and a normal line to the surface of the cutting tool body in a range of 0° to 45°, which is composed of a pitch of 0.25°,
(d) in the direction of the normal line to the surface of the cutting tool body: a periodic composition change of Ti and Al in the composition formula: ($Ti_{1-x}Al_x$)($C_yN_{1-y}$) exists in each of the crystal grains with the NaCl type face-centered cubic structure in the complex nitride or carbonitride layer; and
a difference Δx obtained by subtracting an average of local minimum values from an average of local maximum values of x in the periodic composition change is 0.03 to 0.25, and
(e) in the crystal grains with the NaCl type face-centered cubic structure having the periodic composition change of Ti and Al in the complex nitride or carbonitride layer, a period of the periodic composition change in the direction of the normal line to the surface of the cutting tool body is 3 to 100 nm.

2. The surface-coated cutting tool according to claim 1, wherein
in the crystal grains with the NaCl type face-centered cubic structure having the periodic composition change of Ti and Al in the complex nitride or carbonitride layer:
the periodic composition change of Ti and Al is aligned along with a crystal orientation belonging to equivalent crystal orientations expressed by <001> in the crystal grains;
a period of the periodic composition change in the crystal orientation is 3 to 100 nm; and
an amount of change of an average $X_O$ of content ratio of Al to a total amount of Ti and Al in the plane orthogonal to the crystal orientation is 0.01 or less.

3. The surface-coated cutting tool according to claim 1, wherein
in a case where a lattice constant, a, of the crystal grains with the NaCl type face-centered cubic structure is obtained in the complex nitride or carbonitride layer from X-ray diffraction, the lattice constant a satisfies a relationship, $0.05a_{TiN}+0.95a_{AlN} \leq a \leq 0.4a_{TiN}+0.6a_{AlN}$, in which $a_{TiN}$ is a lattice constant of a cubic TiN and $a_{AlN}$ is a lattice constant of a cubic AlN.

4. The surface-coated cutting tool according to claim 1, wherein
in a case where the complex nitride or carbonitride layer is observed from the vertical section direction:
the complex nitride or carbonitride layer has a columnar structure in which the crystal grains with the NaCl type face-centered cubic structure has an average grain width W of 0.1 to 2.0 μm and an average aspect ratio A of 2 to 10.

5. The surface-coated cutting tool according to claim 1, wherein
in the complex nitride or carbonitride layer, an area ratio of Ti and Al complex nitride or carbonitride with the NaCl type face-centered cubic structure is 70% or more.

6. The surface-coated cutting tool according to claim 1, further comprising a lower layer between the cutting tool body and the Ti and Al complex nitride or carbonitride layer, wherein
the lower layer comprises a Ti compound layer, which is made of one or more layers selected from a group consisting of a Ti carbide layer; a Ti nitride layer; a Ti carbonitride layer; a Ti oxycarbide layer; and a Ti oxycarbonitride layer, and has an average total layer thickness of 0.1 to 20 μm.

7. The surface-coated cutting tool according to claim 1, further comprising an upper layer in an upper part of the complex nitride or carbonitride layer, wherein
the upper layer comprises at least an aluminum oxide layer with an average layer thickness of 1 to 25 μm.

8. The surface-coated cutting tool according to claim 1, wherein
the complex nitride or carbonitride layer is formed by a chemical vapor deposition method in which at least trimethyl aluminum is used as a reaction gas component.

9. A method for producing a surface-coated cutting tool; the method comprising:
a first step of supplying a first gas group including $NH_3$ and $H_2$ for a predetermined supply time; and
a second step of supplying a second gas group including $TiCl_4$, $Al(CH_3)_3$, $AlCl_3$, $NH_3$, $N_2$, and $H_2$ for a predetermined supply time, which is started after start of the first step by a shorter time than the supply time of the first step,
wherein by repeating the first step and the second step with a predetermined period longer than both of the supply time of the first step and the second step, a hard coating layer is formed by chemical vapor deposition on a surface of a cutting tool body made of any one of tungsten carbide-based cemented carbide, titanium carbonitride-based cermet, and cubic boron nitride-based ultra-high pressure sintered material.

* * * * *